United States Patent
Magnussen et al.

(10) Patent No.: US 7,368,853 B2
(45) Date of Patent: May 6, 2008

(54) PIEZOELECTRIC MOTORS AND METHODS FOR THE PRODUCTION AND OPERATION THEREOF

(75) Inventors: Bjoern B. Magnussen, Iserlohn (DE); Peter C. Varadi, El Cerrito, CA (US); Kai Wolf, Wiesbaden (DE); Benjamin Hagemann, Dortmund (DE); Dieter A. Schuler, Stuttgart (DE); Erick M. Davidson, El Cerrito, CA (US)

(73) Assignee: Elliptec Resonant Actuator Aktiengesellschaft, Dortmund (DE)

( * ) Notice: Subject to any disclaimer, the term of this patent is extended or adjusted under 35 U.S.C. 154(b) by 265 days.

(21) Appl. No.: 10/971,862

(22) Filed: Oct. 22, 2004

(65) Prior Publication Data

US 2005/0127790 A1    Jun. 16, 2005

(51) Int. Cl.
*H01L 41/08* (2006.01)
*H01L 2/00* (2006.01)

(52) U.S. Cl. .......................... 310/323.01; 310/323.05; 310/323.09; 310/323.19; 310/354; 310/355

(58) Field of Classification Search .......... 310/323.01, 310/323.05, 323.09, 323.19, 354–355
See application file for complete search history.

(56) References Cited

U.S. PATENT DOCUMENTS

| | | |
|---|---|---|
| 3,469,119 A | 9/1969 | Parkinson |
| 4,019,073 A | 4/1977 | Vishnevsky et al. |
| 4,400,641 A | 8/1983 | Vishnevsky et al. |
| 4,420,826 A | 12/1983 | Marshall et al. |
| 4,453,103 A | 6/1984 | Vishnevsky et al. |
| 4,535,346 A | 8/1985 | Lichti |
| 4,613,782 A | 9/1986 | Mori et al. |

(Continued)

FOREIGN PATENT DOCUMENTS

DE    2445685    4/1976

(Continued)

OTHER PUBLICATIONS

Reguiskis, K. et al, *Vibromotors for Precision Microrobots*, p. 5-6, published by Hemisphere Publishing Corporation in 1988.

(Continued)

*Primary Examiner*—Jaydi A San Martin
(74) *Attorney, Agent, or Firm*—Stetina Brunda Garred & Brucker

(57) ABSTRACT

The invention relates to a piezoelectric motor comprising a piezoelectric component that is connected to a resonator and a two-dimensional resonator that interacts with a movable element, the resonator having principal surfaces that are parallel to each other and that are also identical in shape and size. The invention further relates to methods for producing such piezoelectric motors, wherein the resonators are manufactured by cutting a profiled, extruded bar into lengths or by cutting, preferably by punching, from sheet metal having constant thickness. Finally, this invention relates to a method for exciting such a piezoelectric motor, wherein the excitation frequency or frequencies is/are generated by the control electronics as a function of time in response to the respective peak current and/or in response to the respective phase minimum between current and voltage and/or in response to the change in phase.

41 Claims, 27 Drawing Sheets

U.S. PATENT DOCUMENTS

| | | | |
|---|---|---|---|
| 4,622,483 A | 11/1986 | Staufenberg, Jr. et al. | |
| 4,663,556 A | 5/1987 | Kumada | |
| 4,728,843 A | 3/1988 | Mishiro | |
| 4,812,697 A | 3/1989 | Mishiro | |
| 4,857,791 A | 8/1989 | Uchino et al. | |
| 4,941,202 A | 7/1990 | Upton | |
| 4,959,580 A | 9/1990 | Vishnevsky et al. | |
| 4,997,177 A | 3/1991 | Mori et al. | |
| 5,030,873 A | 7/1991 | Owen | |
| 5,073,740 A | 12/1991 | Jomura et al. | |
| 5,109,698 A | 5/1992 | Owen | |
| 5,155,709 A | 10/1992 | Flanagan et al. | |
| 5,162,692 A | 11/1992 | Fujimura | |
| 5,216,313 A | 6/1993 | Ohinishi et al. | |
| 5,338,998 A * | 8/1994 | Kitani et al. | 310/323.09 |
| 5,448,128 A | 9/1995 | Endo et al. | |
| 5,453,653 A | 9/1995 | Zumeris | |
| 5,469,011 A | 11/1995 | Safabakhsh | |
| 5,566,132 A | 10/1996 | Janus et al. | |
| 5,616,980 A | 4/1997 | Zumeris | |
| 5,640,063 A | 6/1997 | Zumeris et al. | |
| 5,682,076 A | 10/1997 | Zumeris | |
| 5,696,421 A | 12/1997 | Zumeris et al. | |
| 5,714,833 A | 2/1998 | Zumeris | |
| 5,777,423 A | 7/1998 | Zumeris | |
| 5,877,579 A | 3/1999 | Zumeris | |
| 5,900,691 A | 5/1999 | Reuter et al. | |
| 5,907,211 A | 5/1999 | Hall et al. | |
| 6,066,911 A | 5/2000 | Lindemann et al. | |
| 6,068,256 A | 5/2000 | Slutskiy et al. | |
| 6,072,267 A | 6/2000 | Atsuta | |
| 6,242,850 B1 | 6/2001 | Slutskiy et al. | |
| 6,262,514 B1 | 7/2001 | Bansevicius et al. | |
| 6,262,515 B1 | 7/2001 | Yerganian | |
| 6,294,859 B1 | 9/2001 | Jaenker | |
| 6,384,514 B1 | 5/2002 | Slutskiy et al. | |
| 6,512,321 B2 | 1/2003 | Yoshida et al. | |
| 6,664,714 B2 * | 12/2003 | Magnussen et al. | 310/354 |
| 6,690,101 B2 | 2/2004 | Magnussen | |
| 6,825,592 B2 | 11/2004 | Magnussen | |
| 6,870,304 B2 | 3/2005 | Magnussen | |
| 7,061,161 B2 | 6/2006 | Scher | |
| 7,105,987 B2 * | 9/2006 | Witteveen | 310/328 |
| 7,173,362 B2 | 2/2007 | Magnussen | |
| 7,187,102 B2 | 3/2007 | Varadi | |
| 7,224,099 B2 | 5/2007 | Magnussen | |
| 2002/0038986 A1 * | 4/2002 | Magnussen et al. | 310/317 |
| 2007/0025659 A1 * | 2/2007 | Yoda | 385/15 |

FOREIGN PATENT DOCUMENTS

| | | |
|---|---|---|
| DE | 3309239 C2 | 9/1984 |
| DE | 3833342 A1 | 9/1988 |
| DE | 3920726 C2 | 6/1989 |
| DE | 4127163 A1 | 2/1993 |
| DE | 19507996 A1 | 9/1996 |
| DE | 19538978 C1 | 11/1996 |
| DE | 19920436 A1 | 11/2000 |
| DE | 19928780 A1 | 1/2001 |
| DE | 10010707 C2 | 1/2002 |
| EP | 0231940 A2 | 2/1987 |
| EP | 0313072 A1 | 4/1989 |
| EP | 0518262 A2 | 12/1992 |
| EP | 0569673 B1 | 11/1993 |
| EP | 0712170 A1 | 5/1996 |
| EP | 0725450 A1 | 8/1996 |
| EP | 0643427 A1 | 11/1997 |
| EP | 0924778 A2 | 6/1999 |
| EP | 0924778 A3 | 6/1999 |
| EP | 0951078 A1 | 10/1999 |
| EP | 1154496 A2 | 11/2001 |
| GB | 1510091 | 5/1978 |
| GB | 2364965 | 2/2002 |
| JP | 62217880 | 9/1987 |
| JP | 2260476 | 10/1990 |
| JP | 02260582 | 10/1990 |
| JP | 04351200 | 12/1992 |
| JP | 06286401 | 10/1994 |
| JP | 08019275 | 1/1996 |
| JP | 11191976 | 7/1999 |
| SU | 1278994 A1 | 7/1994 |
| WO | WO9750134 | 12/1997 |
| WO | WO141228 A1 | 7/2001 |
| WO | WO 3028199 A2 * | 4/2003 |

OTHER PUBLICATIONS

Krause, W. et al., *Direct-Drive Linear Motors Imprecision Engineering*, p. 303-306, Issue 98, No. 7-8, published by Carl Hanser Publishing Company, Munich, 1990.

*Piezoelectric Ultrasonic Motors*, Jorg Wllaschek, Heinz Nixdorf Institut, Universitat-GP Paderborn, 33095 Paderborn, Germany Jan. 1995.

*PWM Driving Characteristics of Robot Hand with Fingers Using Vibration-type Ultrasonic Motors*, K. Nishibori, H. Obata, S. Okuma; Prodeedings of the EICON '97 23rd International Conference on Industrial Electronics, Control, and Insturmentation; New Orleans, LA, USA; Nov. 9, 1997; pp. 1355-1360.

*New Type of Piezoelectric Ultrasonic Motor*, Maximilan Fleischer, Dieter Stein and Hans Meixner, Siemens AG, Research Laboratories, Otto-Hahn-Ring 6, D-8000-Munchen 83, West Germany May 1998.

* cited by examiner

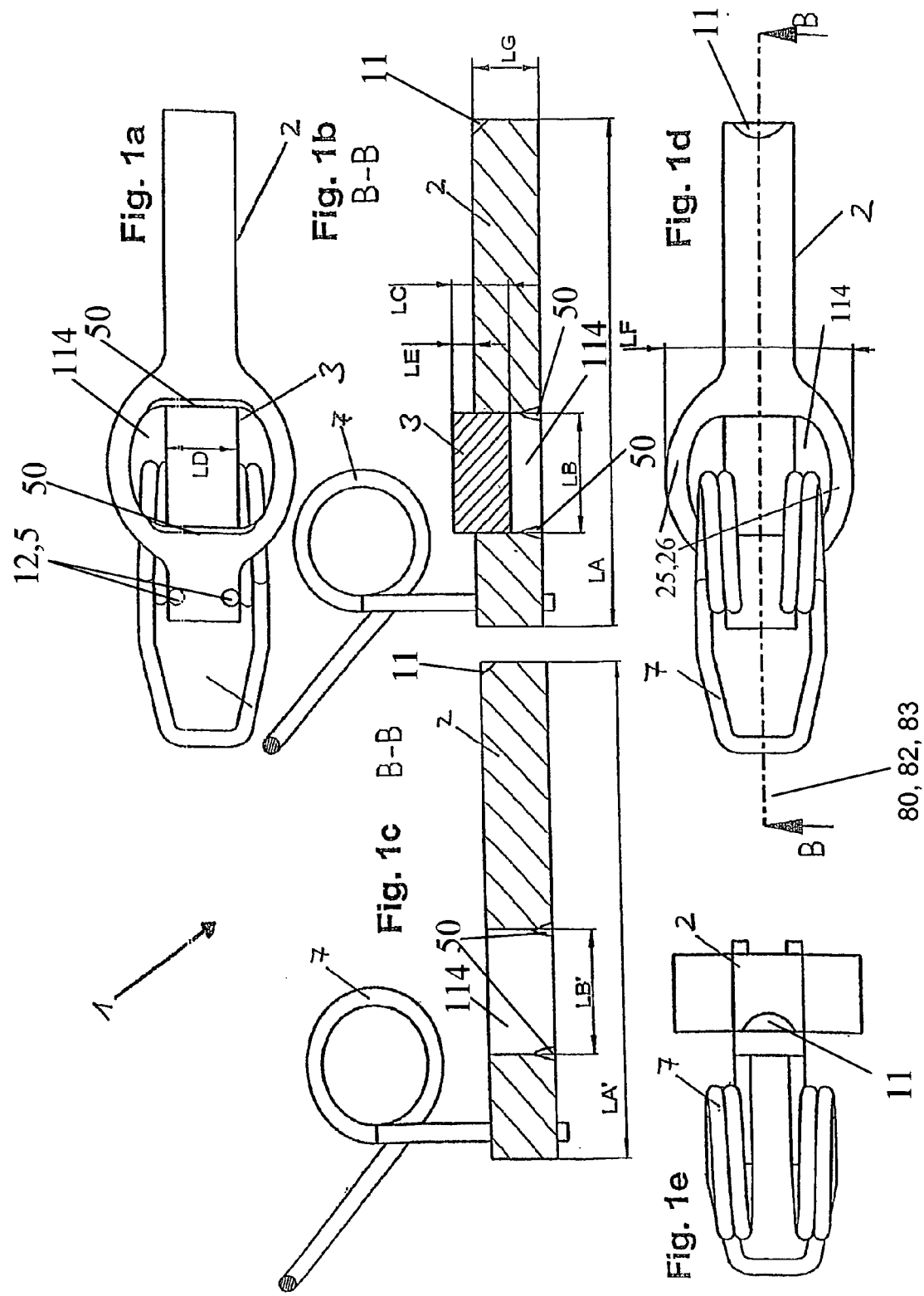

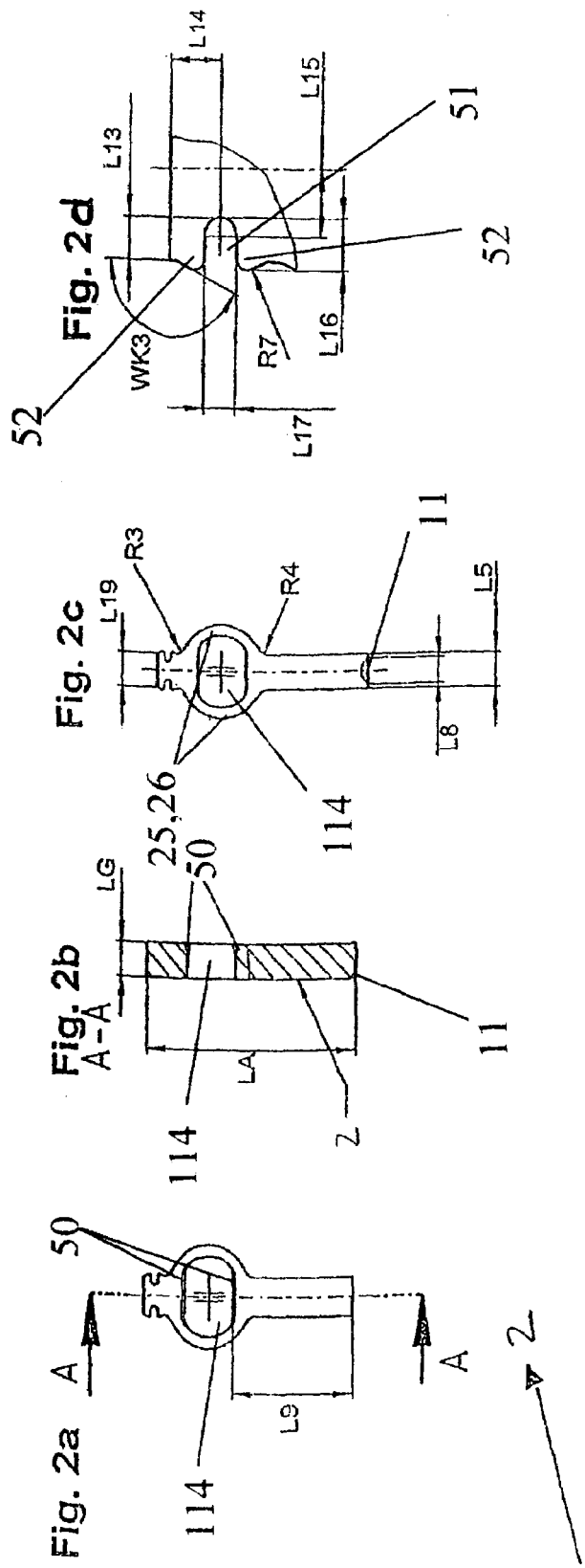

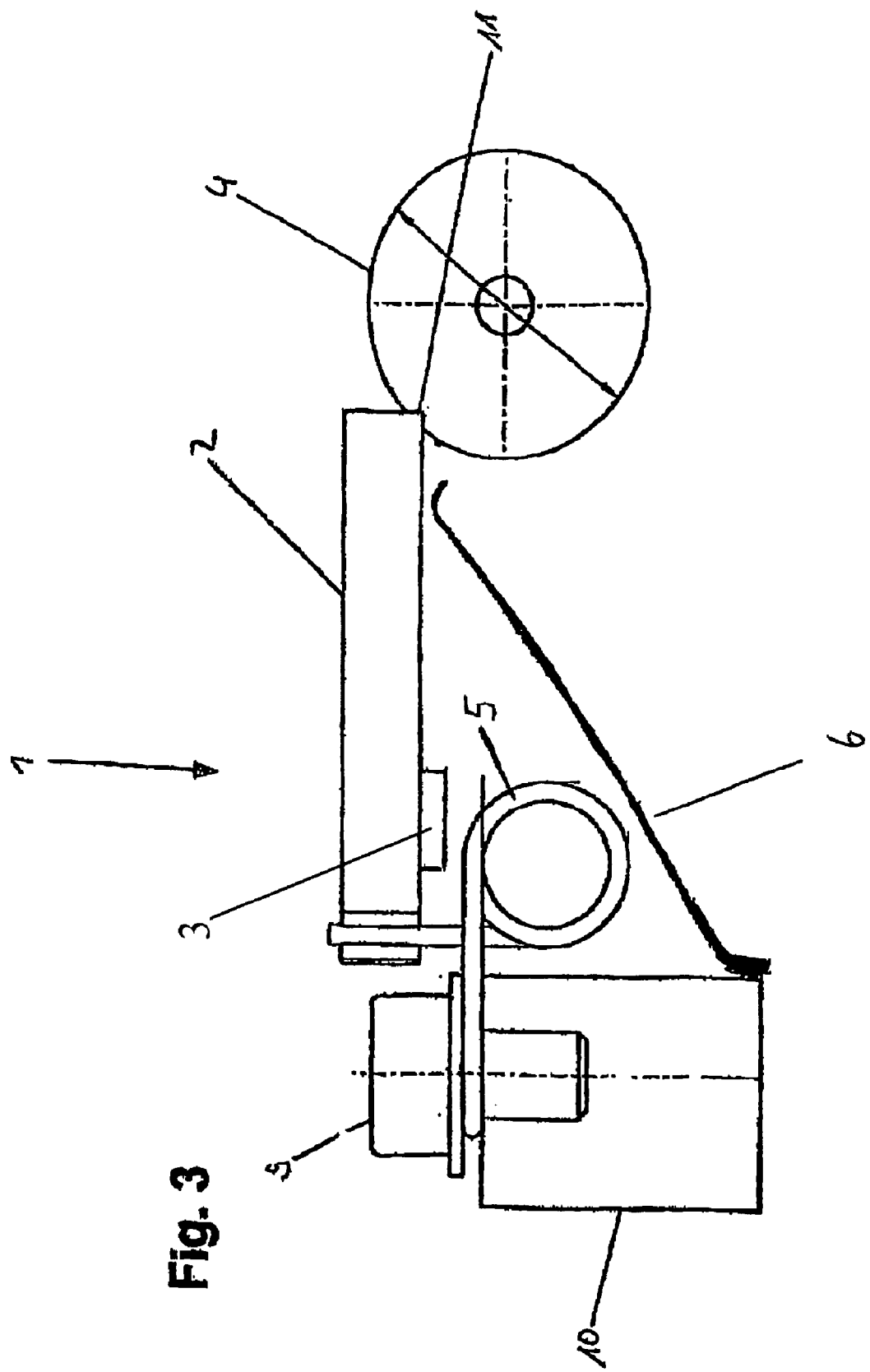

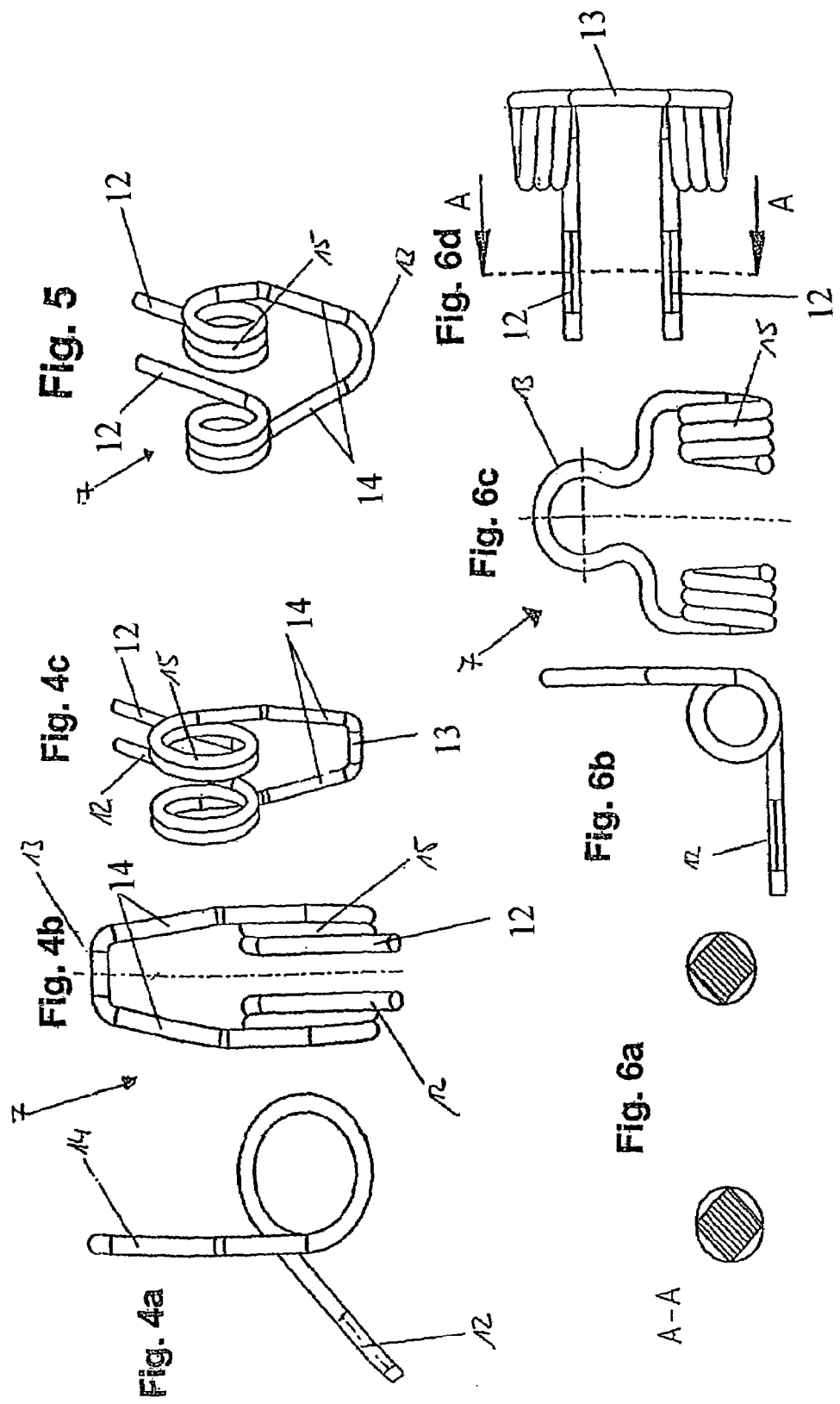

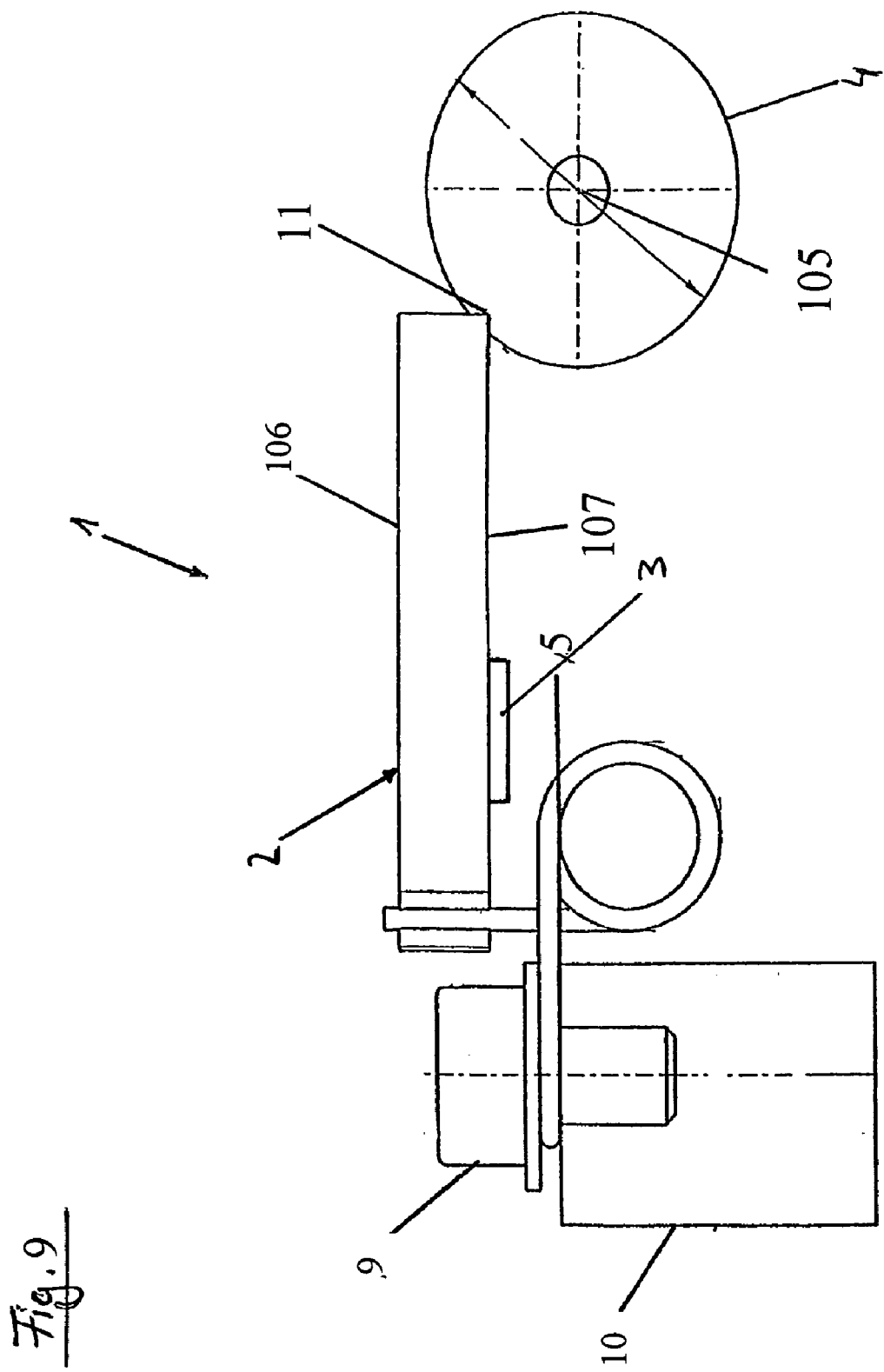

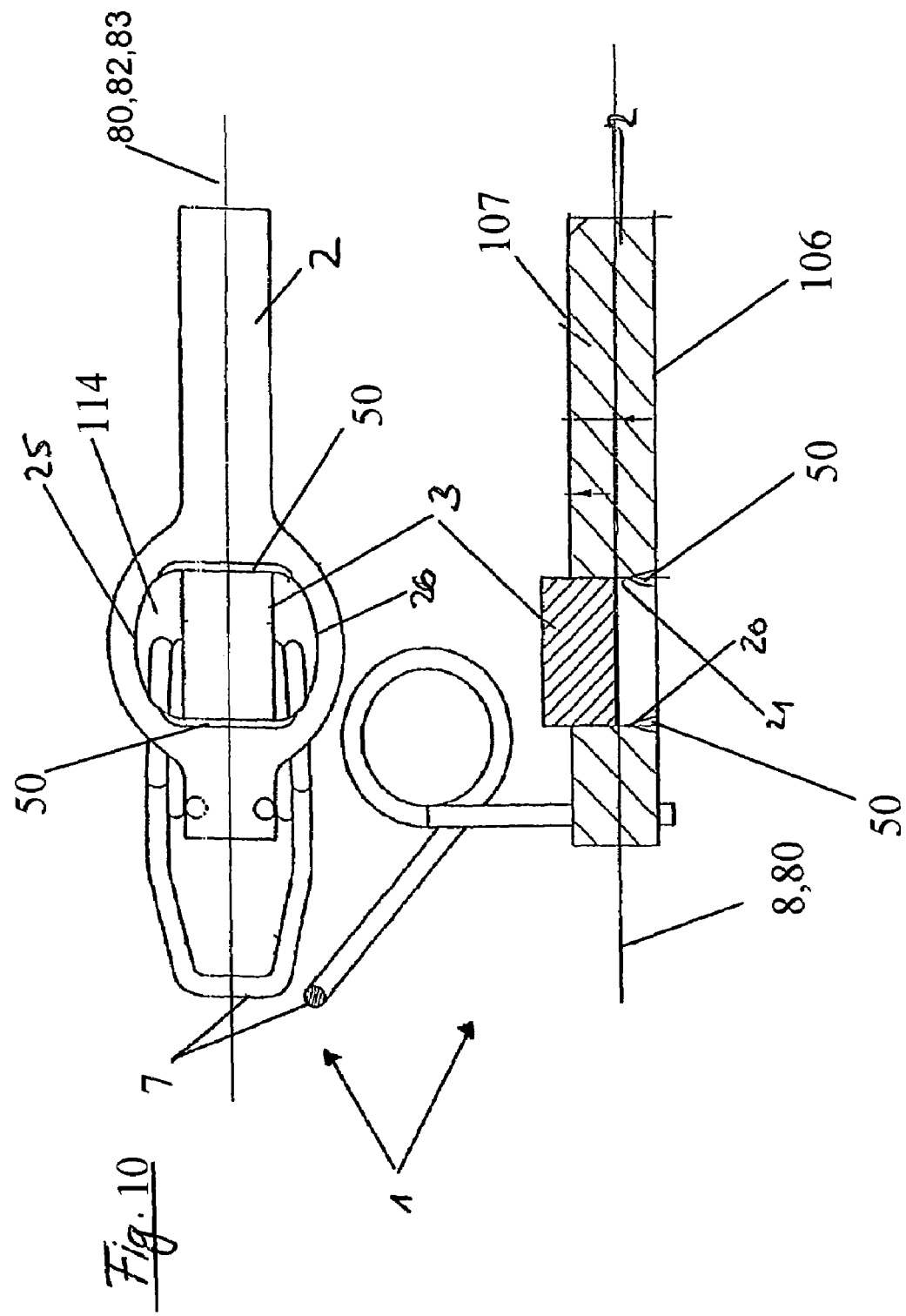

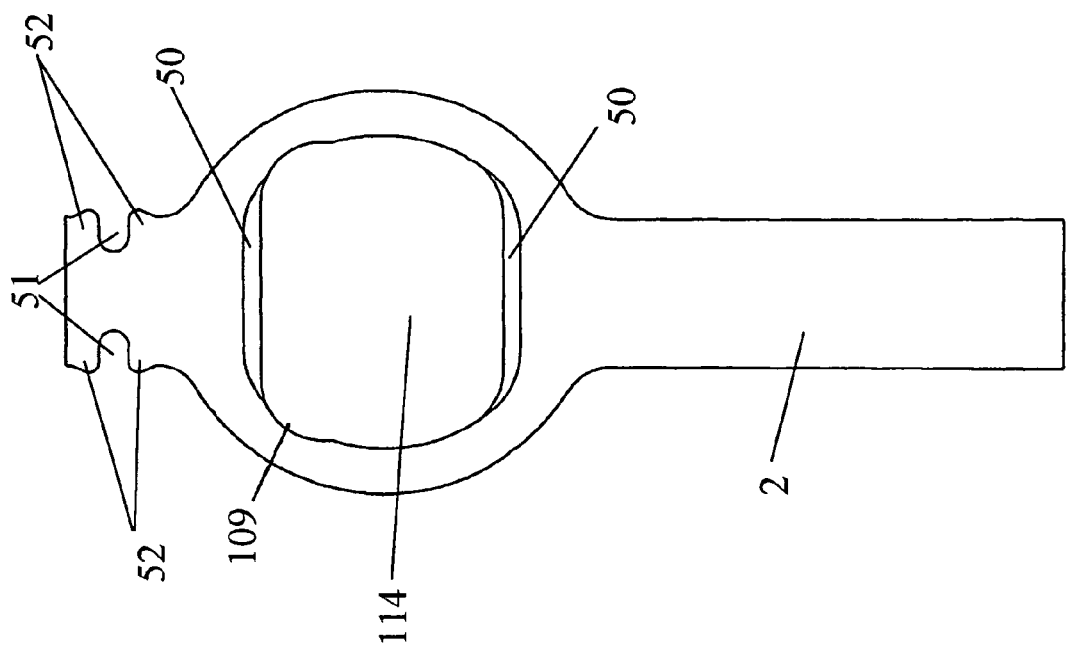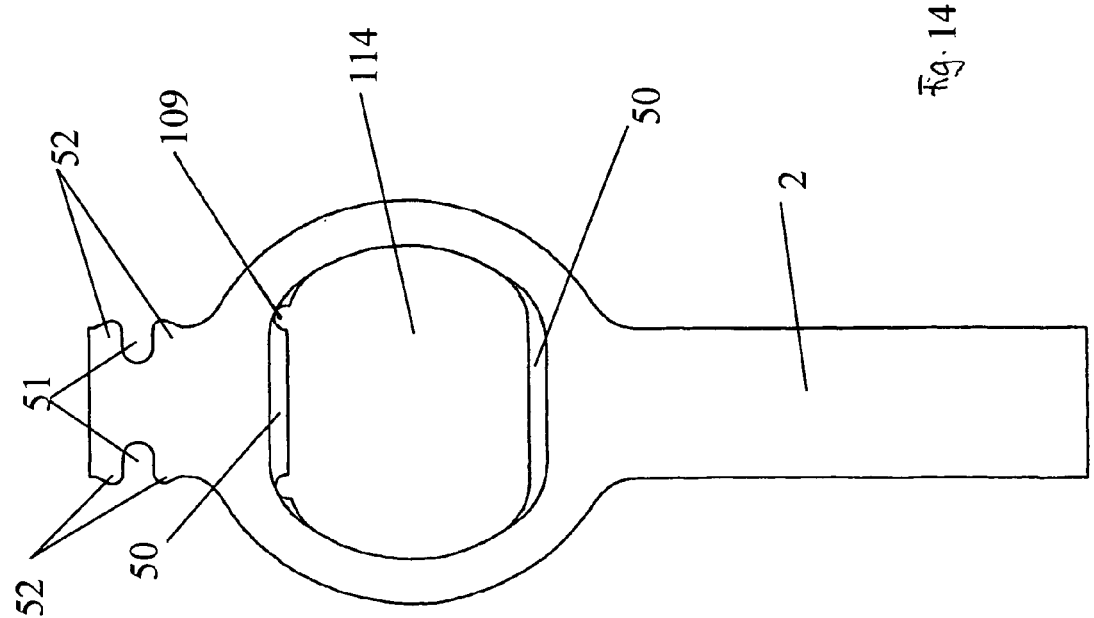
Fig. 14

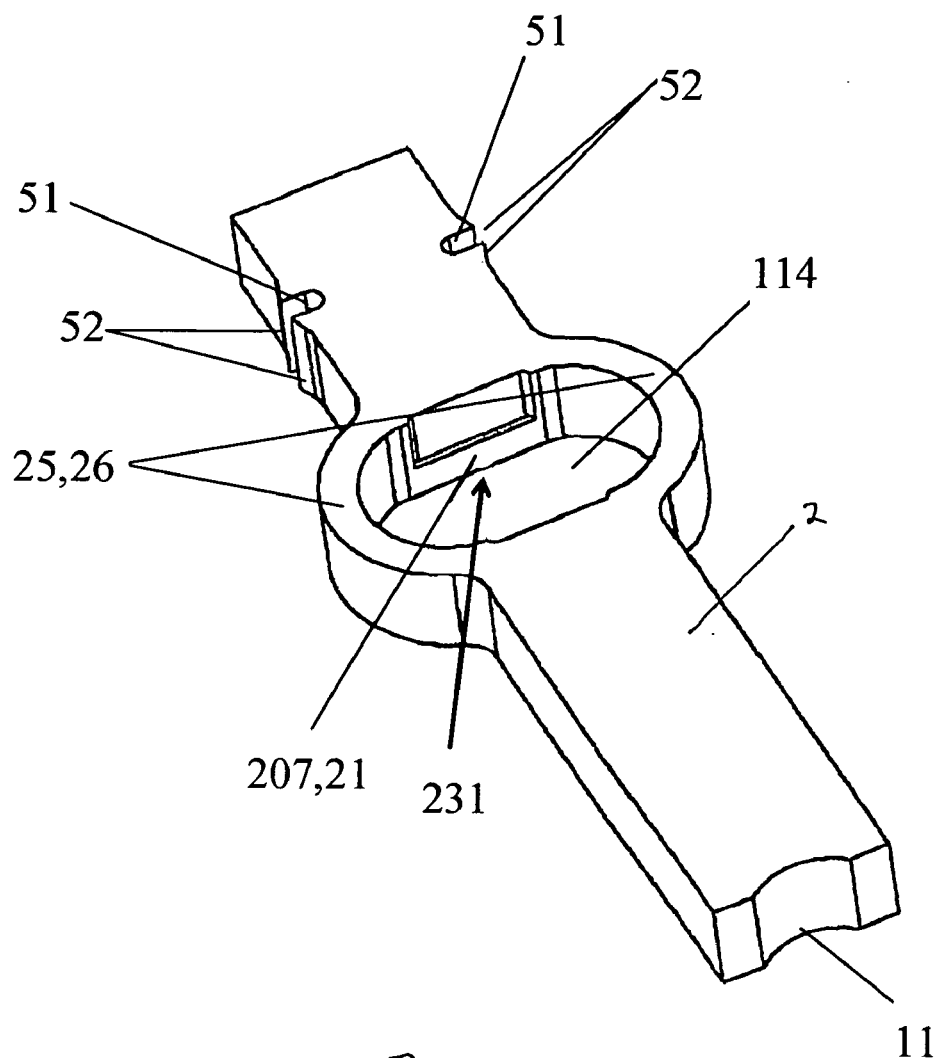
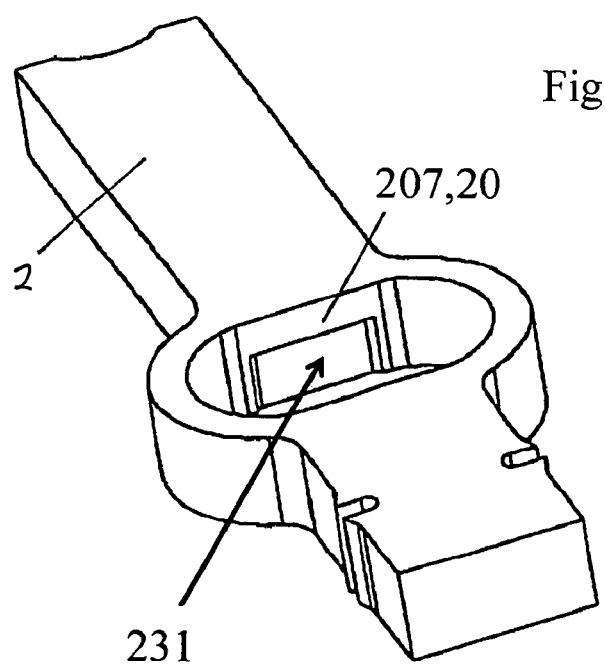
Fig. 15 cross-section c

PIEZOELECTRIC MOTORS AND METHODS FOR THE PRODUCTION AND OPERATION THEREOF

CROSS-REFERENCE TO RELATED APPLICATIONS

This application claims priority under 35 U.S.C. § 119 to application no. PCT/EP03/04072 filed Apr. 17, 2003, titled "Piezo Motor" listing inventors Kai Wolf, Peter Varadi, Bjoern Magnussen, Benjamin Hagemann, Dieter Schuler and Erick M. Davidson; and to application no. PCT/EP03/04131 filed Apr. 22, 2003, titled "Piezo Motor and Methods for the Production and Excitement thereof" listing inventors Bjoern Magnussen, Benjamin Hagemann, Dieter Schuler, Erick M. Davidson, Kai Wolf and Peter Varadi. The entire disclosures of these preceding applications are also incorporated by this reference as though set forth fully herein. This application further claims priority under 35 U.S.C. §119 to German Priority Document no. DE 102 17 963.8 filed Apr. 22, 2002 titled "Piezomotor" listing applicant Elliptec Resonant Actuator AG, Dortmund/DE; and to German Priority Document no. DE 102 27 509.2 filed Jun. 19, 2002 titled "Piezomotor" listing applicant Elliptec Resonant Actuator AG, Dortmund/DE. The entire disclosures of these preceding applications are also incorporated by this reference as though set forth fully herein.

BACKGROUND OF THE INVENTION

This invention relates to a piezoelectric motor comprising a piezoelectric component connected to a resonator and a movable element interacting with the resonator. Furthermore, the invention relates to a method for avoiding failure of such a piezoelectric motor. Contrary to known piezoelectric motors, it is not attempted to avoid wear in the contact portion between the resonator and the movable element, but instead it is attempted to specifically use that wear for optimizing the motor properties and for increasing the motor performance.

Several piezoelectric motors comprising a piezoelectric component connected to a resonator and a movable element interacting with the resonator are known in the prior art. In these motors, piezoelectric components, which vibrate mechanically when an appropriate electric voltage is applied thereto, are interactively connected to a resonator, which in turn contacts a movable element. The resonator transforms the vibrations of the piezoelectric component into preferably elliptical oscillations of the contacting portion between the resonator and the movable element. The movable element preferably moves in a first direction when a first voltage with a first frequency is applied to the piezoelectric component, and further moves in a second preferably opposite direction when a second voltage with a second frequency is applied to the piezoelectric component.

By way of these piezoelectric motors, electrically operated actuators can be moved over very exactly adjustable distances. This motion is silent to human hearing and consumes especially little energy. The piezoelectric motors are particularly cheap to manufacture. These piezoelectric motors can be used where a compact design requires a motor with little space requirements or where no or only small magnetic fields may be generated during operation.

Piezoelectric motors are mass products that, for example, in children's toys cause certain elements to move, or that in vehicles electrically deploy or actuate a variety of elements such as the ash tray or the side view mirrors. However, in all applications, one needs to ensure that the motors do not suffer a major loss of performance during operation and thus fail after a brief period of operation or do not perform their task in a satisfactory fashion anymore.

One goal of the invention is, therefore, to provide a piezoelectric motor that does not have the disadvantages of the prior art, and to provide a method for reducing the risk of failure of a piezoelectric motor during its life time.

This invention also relates to further piezoelectric motors that comprise at least one piezoelectric component connected to a resonator, and a movable element that interacts with the resonator. Furthermore, this invention relates to a method for manufacturing such a piezoelectric motor and also relates to a method for the excitation thereof.

Piezoelectric motors of the type just mentioned are known from the prior art that the Applicant has created. Therein, piezoelectric components, which vibrate mechanically when an appropriate electric voltage is applied thereto, are coupled to a resonator, which itself abuts a movable element. The resonator transforms the vibrations of the piezoelectric component into preferably elliptical vibrations of the resonator contact portion that touches the movable element. The movable element preferably moves in a first direction when a first voltage having a first frequency is applied, and moves in a second, preferably opposite direction when a second voltage having a second frequency is applied.

Having particularly low energy consumption and particularly low manufacturing cost, these piezoelectric motors allow moving electrically operated actuators over very exactly tunable distances in a manner that humans cannot hear. These piezoelectric motors have applications where a compact design requires a motor with little space requirements, or also where no or only few magnetic fields may be generated during operation.

Piezoelectric motors are mass produced products that, e.g., in toys for children, cause individual elements to move, or that in cars electrically extend, or adjust the position of, the ash tray or the side view mirror.

Examples of the piezoelectric component and the resonator are described in DE 100 62 672 A1 and in the unpublished German patent application with file number 101 41 820.5 (which was published as DE10141820 A1). There, the resonator is coupled to the piezoelectric component and transfers its vibrations onto the movable element. In doing so, the resonator preferably vibrates close to one of its natural modes. An example of an embodiment of the piezoelectric motor has been described in WO 01/41228A1 (the disclosure of which is now U.S. Pat. No. 6,768,245) or in the application having the file number PCT/EP01/03245 (the disclosure of which is now U.S. Pat. No. 6,690,101). All the patent applications mentioned above are incorporated herein by reference and are thus considered a part of this disclosure.

In typical piezoelectric motors, the excitation signal is transmitted to the piezoelectric component with a frequency that causes the resonator to vibrate in a natural mode. These resonance frequencies generate high vibration amplitudes and thus are generally considered to be advantageous modes of operation that have advantageous piezoelectric motor performance characteristics. The performance characteristics in this case are the forces that arise in the region of the contact portion between the resonator and the movable element, as well as velocities.

When piezoelectric motors are mass produced, it is important to achieve high reproducibility of the vibration modes that are transmitted from the piezoelectric component to the resonator. In particular, those vibration modes are crucial that occur in the region of the contact portion between the resonator and the movable element, whose motion is caused by the transferred vibrations.

The type of vibration mode at the contact portion fundamentally depends on the resonator geometry and the clamping location of the piezoelectric component within the resonator. Experience has shown that the reproducibility of the desired modes of operation and the reproducibility of the desired piezoelectric motor performance characteristics in many cases require a finishing step during the production of piezoelectric motors.

It is also a purpose of the invention to provide a piezoelectric motor that does not have the disadvantages of the prior art and to provide a method that considerably simplifies the manufacture of piezoelectric motors and their excitation.

SUMMARY OF THE INVENTION

The problems of the prior art are addressed with motors having the following basic features. There is provided a piezoelectric motor having at least one piezoelectric component that is connected to a resonator and having a movable element that interacts with the resonator, characterized in that at least during portions of the service life at least one piezoelectric motor operating state variable changes without an external influence and thus improves or lessens motor efficiency. The change of the operating state variable occurs slower than the duration of one vibration period of the excitation frequency, preferably 5 times slower than the duration of one vibration period of the excitation frequency. There is also provided a piezoelectric motor having at least one piezoelectric component that is connected to a resonator and having a movable element that interacts with the resonator, characterized in that the resonator interacts with the movable element through a contact portion and that the contact portion changes without an external influence at least during portions of the service life of the piezoelectric motor. The change of the operating state variable occurs slower than the duration of one vibration period of the excitation frequency, and preferably 5 times slower than the duration of one vibration period of the excitation frequency.

Further provided is a piezoelectric motor having at least one resonator, at least one piezoelectric component hat has two electric terminals and is connected to the resonator, and a movable element that interacts with the resonator. The motor is characterized in that at least during portions of the service life at least one piezoelectric motor operating state variable changes without an external influence. The change of the operating state variable occurs slower than the duration of one vibration period of the excitation frequency, preferably 5 times slower than the duration of one vibration period of the excitation frequency.

There is also provided a method for avoiding failure of a piezoelectric motor having any features of combinations of features described herein, wherein the change of at least one operating state variable causes an increase of the efficiency of the piezoelectric motor. There is further provided a method for avoiding failure of a piezoelectric motor having any features of combinations of features described herein, wherein the change of at least one operating state variable counteracts a change in another operating state variable, the change in another operating state variable having occurred without an external influence.

There is thus provided a piezoelectric motor wherein a change of at least one operating state variable improves or reduces the motor performance. The piezoelectric motor disclosed herein is especially easily manufactured and offers a constant performance or a performance that preferably increases with the duration of operation. An initial test of the piezoelectric motor can determine the motor's minimal degree of efficiency even before regular motor operation actually begins.

Any variable that influences the state of operation of a motor is an operating state variable. The operating state variable is preferably the frequency of operation, the electrical current consumption, the vibration modes of the resonator, the pressure and/or the friction properties between the resonator and the movable element, the resonator's orientation and/or impact angle at the contact portion to the movable element, or the shape, position and/or the orientation of the contact portion. The change of the operating state variable preferably occurs slowly compared to the service life of the motor. It is preferable that more than one oscillation period of the excitation signal to the piezoelectric component is needed in order to change the respective operating state variable. Preferably more than 5 oscillation periods are needed. The operating state variables are preferably understood as quantities that are averaged over at least 10 periods of the excitation signal. The change occurs preferably in an irreversible manner. The change of the operating state variable preferably occurs without external influence. This means preferably that the change of the respective operating state variable is achieved without a change of the control signal to the piezoelectric component.

An operating state variable is thus a quantity that is linked to motor performance and whose rate of change is slow compared to the period of the piezoelectric motor control signal during motor operation. Operating state variables preferably cause motor performance to vary at a rate that is slower than five oscillation periods of the piezoelectric motor control signal. Operation state variables change due to regular motor operation and due to the interaction between the piezoelectric motor and a movable element during regular motor operation. Operation state variables are intrinsic to the piezoelectric drive system and are not caused by external means other than those needed for regular motor operation.

For example, the optimal frequency of operation, i.e., the frequency at which a sinusoidal electric signal to the piezoelectric component would cause optimal motion of the movable element, typically changes with piezoelectric motor temperature. During regular motor operation, the piezoelectric motor temperature increases due to dielectric losses in the piezoelectric component at a rate that is slow compared to the excitation frequency. The rise in temperature typically causes a reduction of the optimal frequency of operation at a similarly slow rate. In applications, the frequency of the control signal to the piezoelectric component is often adjusted in order to compensate for the varying optimal frequency of operation in order to avoid a change of motor performance. As this example shows, temperature and the optimal frequency of operation are operation state variables. The actual control signal on the other hand is not.

Other operation state variables are, for example, the state of wear of the resonator contact portion to the movable element and the characteristics that depend thereon, such as the shape of the contact portion or the location and orientation of the resonator with respect to the movable element.

A calibration adjustment on the other hand is considered an external influence as it does not occur during regular motor operation. While such an external means may also cause an operation state variable to change, such means will not be considered here. A noted exception is externally forcing a relative motion between the resonator and the movable element during a running-in phase, which occurs before regular motor operation takes place.

The elements of the piezoelectric motor are preferably configured so that motor operation, and particularly the running-in phase of the motor, modifies the motor performance in a predetermined manner. One the one hand, this is achieved by various changes of operating state variables mutually and almost completely compensating each other. On the other hand, this is achieved by using elements and/or materials that during the running-in phase maintain the piezoelectric motor performance at a constant level or preferably increase the performance. All in all, the motor performance can also worsen due to the change in the operating state variable.

In particular if one knows the running-in behavior of the elements and if one knows the dependence of the operation properties on the duration of operation of the piezoelectric motor, then the change of motor performance that is caused by the running-in procedure or by the duration of operation can be compensated, or it can also be supported if so desired, preferably by a predetermined change of one or more other operating state variables.

The piezoelectric component and the resonator are described in an exemplary fashion in DE 100 62 672 A1 and in the unpublished German patent application with the application number 101 41 820.5 (which was published as DE10141820 A1). The resonator is interactively connected to the piezoelectric component and transfers its vibrations onto the movable element. In doing so, the resonator preferably vibrates close to its resonance. The resonator preferably comprises a flat and essentially two-dimensional shape wherein the resonator shape remains nearly unchanged along the third dimension, which is preferably taken along the thickness of the resonator. An exemplary embodiment of the piezoelectric motor has already been described in WO 01/41228A1 (the disclosure of which is now U.S. Pat. No. 6,768,245) or in the parallel application with the application number PCT/EP01/03245 (the disclosure of which is now U.S. Pat. No. 6,690,101). These patent applications are hereby incorporated by reference and thus are considered to be parts of the disclosure.

In a preferred embodiment, the piezoelectric component has a monolithic construction. In a particularly preferred embodiment, this monolithic piezoelectric ceramic component comprises internal copper electrodes that are arranged in an interlocking comb-like fashion. Such piezoelectric components are described in the German patent application 101 46 704.4, which was published as DE101 46 704 A1. This patent application is hereby incorporated by reference and thus is considered to be a part of the disclosure. The piezoelectric ceramics is preferably implemented as a single piece (even though it may be a multilayered component).

In a preferred embodiment, the piezoelectric motor is excited by a single piezoelectric component having two terminals for applying an excitation signal. In a particularly preferred embodiment, the signal is a sinusoidal or a rectangular wave signal. This particularly preferred embodiment of the piezoelectric motor permits using signals that can more easily be generated than saw-tooth shaped signals.

The vibration modes of the resonator are the result of the position and the clamping of the piezoelectric component as well as of the resonator shape and its mass. The running-in phase and the duration of operation, respectively, directly influence the vibration modes. Furthermore, different regions of the resonator perform different vibrations. The contact portion between the resonator and the movable element changes during the running-in phase as well as during operation of the motor. In this manner, by way of an adapting contact portion, a region of the resonator can transfer vibrations onto the movable element that are decidedly different from the vibration modes of the contact portion at the start of operation of the piezoelectric motor.

There is thus provided a piezoelectric motor comprising a resonator interactively connected to a piezoelectric component and configured to exhibit different vibrations in different regions of the resonator during operation of the piezoelectric motor when an electric input signal excites the piezoelectric component to vibrate, wherein the resonator has a contact portion to the movable element and wherein the contact portion is allowed to be worn either due to piezoelectric motor running-in or due to regular piezoelectric motor operation, and wherein the wear of the contact portion consecutively exposes different regions of the resonator to interaction with the movable element, so that the consecutively different vibrations of these different, consecutively exposed regions cause the motor performance to change in a predetermined manner. In a preferred embodiment of the piezoelectric motor, the wear of the resonator contact portion is further configured to simultaneously cause the resonator location and/or orientation to change with respect to the movable element, this change being simultaneous with the consecutive exposing of different resonator regions so that the different vibrations are always oriented in a predetermined way with respect to the movable element and the resulting motor performance is thus maintained in a predetermined manner.

In a preferred embodiment, the piezoelectric motor also comprises an elastic element for resiliently urging the resonator contact portion against the movable element and for maintaining a predetermined resonator location and/or orientation with respect to the movable element. In a preferred embodiment, the resilience of the elastic element causes that resonator location and/or orientation to change when the resonator contact portion is worn. In a further preferred embodiment, the elastic element also mounts the resonator to a base.

In a preferred embodiment, the resonator behavior during running-in and operation, respectively, is preferably measured by way of a measurement of the changing vibration modes, of the frequencies, of the degree of efficiency, etc. In this way, the running-in behavior of the resonator can be determined with simple means. Subsequently, by way of a predetermined change of an operating state variable, preferably by way of adapting the operating frequency to the changed resonance frequency, the mechanical power of the piezoelectric motor can be maintained at least at a constant level.

The contact portion between the movable element and the resonator is a surface, and preferably a two-dimensional surface or even a curved surface when the geometries of the two elements mutually and preferably exactly conform to each other. During operation of the piezoelectric motor, the running-in causes changes of the contact portion, which then represents a modified area whose position, shape and/or orientation is different compared to its original state. Therefore, in a preferred embodiment, the change of the contact portion occurs in such a manner that the mechanical power of the piezoelectric motor is increased. It is preferable if the contact portion increases in size compared to the initial state and/or if the contacting angle between the resonator and the movable element changes during the duration of operation of the motor.

The normal contact force between the resonator and the movable element occurs in their mutual contact portion and, together with the friction force, directly influences the mechanical power that is transmitted from the piezoelectric motor to the movable element. The normal contact force depends on the stiffness of the elastic element and on what distance the elastic element moves the resonator in order to compensate for wear at the resonator tip. In prior art systems, one often encounters the problem that over time this normal contact force deteriorates to the point where the motor ceases to generate a sufficient amount of mechanical power. A known countermeasure is the use of very hard, wear-resistant materials.

In a preferred embodiment, an element, preferably a spring, having small stiffness is used as elastic element, the element being preloaded by a large amount as can bee seen by comparing the unloaded spring in FIG. 1b with the loaded and mounted spring in FIG. 3. Wear of the contact portion then results in a comparably small change in contact force.

This change occurs during the useful service life of the motor and can advantageously be influenced in a predetermined manner by configuring the surface of the contact portion to be worn such that properties can be increased, decreased, or maintained at constant levels in a predetermined manner.

It is advantageous to configure the contact portion to be initially small, which offers the advantage of a quick running-in of the motor, but then to be enlarged by wear, which results in a considerable wear reduction. The contact portion can advantageously grow to the extent that with a concurrent slight decrease of preload due to contact portion growth, the pressure is reduced to a point where wear practically ceases to take place. It is advantageous if the contact portion is enlarged by a factor of at least 1.5. It is even more advantageous if the contact portion grows by a factor of at least 10. It is advantageous if the contact portion reaches a size of at least ¼*LG*L5 (see FIG. 1b) where LG corresponds to the resonator thickness and L5 corresponds to the width of the resonator leg that abuts the contact portion.

The process of displacing the contact portion advantageously brings other points on the resonator into contact with the movable element. These points can exhibit different motion vectors as FIG. 7 illustrates. By this property, the predetermined manipulation of the motor performance over the motor's life time is also possible. By selecting an appropriate elastic element 5, e.g. a coil spring 7, the angle of the motion vectors can advantageously be configured as a function of the duration of operation. It is advantageous to configure the angle change that is due to contact portion wear in such a manner that, corresponding to the state of wear, the motion vectors form a predetermined angle to the movable element. This angle is advantageously such that the motor either generates an optimal driving force or exhibits a predetermined driving force history.

The wear of the contact portion can advantageously be larger than 0.05*LG (where LG corresponds to the thickness of the resonator per FIG. 1b) without changing mechanical power by more than 25%. The wear of the contact portion can even more advantageously be larger than 0.3*LG without changing mechanical power by more than 15%. The motor can advantageously be configured to exhibit increasing motor performance over a specified duration of operation.

There is thus provided a piezoelectric motor comprising a resonator having a contact portion in interactive contact with a movable element, wherein the contact portion is allowed to be worn during running-in and/or during regular motor operation, wherein the contact portion is configured to be initially small in a virgin state and than to increase in size due to wear. The initial, virgin contact portion is preferably an edge of the resonator or a preformed surface shape that conforms to the movable element. The increase of contact area of the resonator contact portion causes the contact pressure, which is approximately calculated as contact force divided by contact area, to decrease, which results in reduced subsequent wear. Wear also causes the contact portion to recede into the resonator, which causes the elastic element to resiliently give way in order to maintain the resonator in contact to the movable element. As a result, the resilient force of the elastic element also decreases simultaneously with the increasing contact area, which reduces subsequent wear even more. By themselves or in combination, these two effects can bring wear and the motor performance variations that depend thereupon to a virtual standstill. This state of standstill in some sense represents an equilibrium and is preferably reached during the running-in phase of the piezoelectric motor but may also be reached later during regular operation.

Using an elastic element with a small stiffness also offers advantages regarding the tolerance requirements during assembly of the motor. Advantageously, elastic elements with nonlinear characteristics can also be used.

In a particularly preferred embodiment, this elastic element comprises a coil spring that is connected to the resonator, wherein the coil spring has preferably round coil portions. Moreover, in an exceptionally preferred embodiment, the coil spring is damped, preferably by a foamed material that has been pressed into the coils. In this particularly simple manner, a suspension for the piezoelectric motor is created that on one hand is capable to compensate for the running-in induced changes in the operating state variables of the piezoelectric motor and to keep the contact force in the contact portion constant. On the other hand, spring vibrations that are superposed onto the resonator vibrations are reduced in this way.

In a further preferred embodiment, the coil spring comprises coil windings that are configured to not touch each other. In a particularly preferred embodiment, this is achieved by a spring that in the region of its windings comprises a defined inclination of the planes that are spanned by the individual windings. In this manner one securely avoids that those resonator vibrations that are absorbed by the spring are afflicted by friction and cannot be transformed into piezoelectric motor driving force.

There is thus provided an elastic element for resiliently urging the resonator of a piezoelectric motor against a movable element, wherein the elastic element comprises a coil spring having a helical coil portion made up of windings, the helical coil portion having a sufficient pitch, and the windings having a corresponding sufficient mutual distance, that prevents the windings to touch each other at rest and when vibrating during use of the piezoelectric motor. Preventing mutual, intermittent vibration-induced contact during piezoelectric motor operation reduces the amount of energy that is absorbed by the spring and is thus not available for moving the movable element.

In addition, in a further particularly preferred embodiment, the coil spring is pressed into recesses in the resonator. The springs are hereby pressed into the recesses by urging a flat urging tool against the spring wire. In a particularly preferred embodiment, the diameter of the spring wire is somewhat larger than the width of the recess so that a form-fit is created between the resonator and the spring in such a way that there is no air gap. In a particularly preferred embodiment, the resonator further comprises a bulge that extends above the resonator side and that is located directly next to the recess. In this particularly advantageous embodiment, the urging tool molds the bulge material around the wire and thus causes a partial enclosure of the wire. Therefore, a force- and form-fit between the coil spring and the resonator is achieved with particularly simple means, the means securely preventing a loss in performance due to vibration components being absorbed and resorbed by the joint.

In an exceptionally preferred embodiment, the wire comprises a cross-section that at least in the region of the resonator joint is non-circular. It can also be extremely advantageous to introduce an additional joining means at the joint such as, for example, an adhesive. In this particularly simple manner, a joint to the resonator is created that also inhibits twisting.

The impact angle of the resonator onto the movable element, i.e., the orientation of an elongated resonator with respect to the movable element, is measured in the contact portion between the two elements. This contact portion is spanned on the one hand by the surface of the movable element at the driving point, and on the other hand by the direction of vibratory motion of the resonator at the corresponding contact point.

When in a particularly preferred embodiment coil springs are used that are joined to the resonator, then the resonator orientation, and therefore the impact angle, i.e., the orientation of a principal axis of the resonator with respect to the contact portion, can change during the duration of operation in order to attain a desired motor performance.

In a preferred embodiment, the resonator and/or the movable element comprise several materials in at least the contact portion. For example, the resonator and/or the movable element can comprise a hardened core by the contact portion. This embodiment causes a relatively quick running-in phase of the piezoelectric motor because, after the relatively soft layer has quickly worn off, constant conditions prevail over an extended period of time due to the harder core.

In a further preferred embodiment, the surfaces of the resonator and/or of the movable element comprise a surface coating with selected friction properties in their respective contact portion. After the operation of the piezoelectric motor has worn off this surface coating, the friction properties of the base material determine the mechanical power of the piezoelectric motor. In using particularly simple means, one thus can transition from one set of friction properties to another set of friction properties in order to influence the piezoelectric motor performance in a preferably positive manner.

If it is desired that the contact portion adapts during operation of the piezoelectric motor, it can be advantageous if the surface of the resonator and/or of the movable element comprises a coating having abrasive particles such as, for example, glass fibers or glass spheres, carbon fibers, or mineral fillers for polymers. The running-in phase of the piezoelectric motor and the phase of mutual adaptation between the respective contact portions occur particularly quickly in this case. The equilibrium whereat nearly no change of the contact portions is observed during the duration of operation is also particularly quickly reached.

In a further preferred embodiment, it is arranged that the service life of the piezoelectric motor is terminated when at least one operating state variable or the generated driving force leaves a predefined domain so that the replacement of the piezoelectric motor is needed. In a preferred embodiment, the elastic element urging the resonator to the movable element comprises a limiting element for this purpose so that no more forces are transmitted when a predetermined deflection is reached. In a further preferred embodiment, the piezoelectric motor comprises a counter of operating hours that switches the piezoelectric motor off after a predetermined duration of operation is reached. In this manner, simple means guarantee that piezoelectric motors provide persistently adequate mechanical power for a particular application without uncontrolled deterioration of performance.

The operation hours of the piezoelectric motor can be determined by measuring the changing operating state variables. The measurement can be done, for example, using an electrical contact that opens or closes when a predetermined deviation from certain initial states is reached. By the same token, one can determine the resonance frequencies of the piezoelectric motor, which change during the duration of operation.

There is thus provided a piezoelectric motor that is configured to cease operation, or to fail, when a predetermined operating state is reached. The motor is thus prevented from slowly and gradually deteriorating into a domain of uncertain operational characteristics. For example, a piezoelectric motor comprising an elastic element can be equipped with a limiting contact element for closing an electrical circuit when it contacts an electrically conducting portion of the resonator. The contact element is configured such that the contact occurs when the resonator contact portion has been worn by a predetermined amount and the elastic element thus has relocated and/or reoriented the resonator by a predetermined amount. If the piezoelectric motor is configured to wear at a predetermined rate depending on the total amount of relative motion between the resonator and the movable element, predetermined motor failure will occur after a predetermined total distance of motion of the movable element.

The method for avoiding piezoelectric motor failure arranges for a change, and preferably an increase, of piezoelectric motor efficiency by way of a predetermined change of at least one operating state variable. Consequently the gradual loss of piezoelectric motor performance is prevented in a safe and effective manner.

In a preferred embodiment of the method, the change of at least one operating state variable counteracts the change of another operating state variable, which has no external cause. In this manner there is thus provided a method that when executed ensures a constant efficiency of the piezoelectric motor during its entire service life.

A further object of the present invention is a method for the running-in of a piezoelectric motor, characterized in that the resonator and the movable element are moved relative to each other with external means before the motor enters into its actual intended service so that the contact portion between the resonator and the movable element is ground in.

In a preferred embodiment, the surface of the movable element is allowed to wear in addition to, or instead of, allowing the resonator contact portion to wear. Similar properties as for the case of resonator wear alone can than be derived. Instead of the resonator contact portion receding into the resonator due to wear at the contact portion, the surface of the movable element withdraws instead.

One task of the invention is solved by a piezoelectric motor comprising at least one piezoelectric component that is connected to a resonator and that sets it in vibrations and that, where needed, further comprises an elastic element for urging the resonator against a movable element, wherein the resonator comprises a plane of symmetry and wherein the resonator can be operated at least at two frequencies of operation ($f_1$, $f_2$), and wherein the piezoelectric component and/or the elastic element are configured in the resonator in such a way that the plane of symmetry is not a plane of symmetry of the piezoelectric motor so that the movable element can be driven by the resonator at the two frequencies of operation ($f_1$, $f_2$) in two opposite directions.

In addition, the task is solved by a piezoelectric motor comprising at least one piezoelectric component that is connected to a resonator and sets it in vibration, and that, where needed, further comprises an elastic element for urging the resonator against a movable element, wherein the resonator can be operated at least at two frequencies of operation ($f_1$, $f_2$), and wherein the piezoelectric component and/or the elastic element are located to drive the movable element in two opposite directions using the resonator at the lower and upper frequency of operation ($f_1$, $f_2$), wherein both frequencies of operation are smaller than one half of the frequency that is calculated as the wave propagation speed for longitudinal waves of the resonator material divided by the largest resonator dimension.

The upper frequency of operation preferably is no larger than 1.5 times the lower frequency of operation.

Moreover, the problem is solved by a piezoelectric motor comprising at least one piezoelectric component that is connected to a resonator and sets it in vibration, and that, where needed, further comprises an elastic element for urging the resonator against a movable element, wherein the resonator can be operated at least at two frequencies of operation $f_1$, and $f_2$, and wherein the piezoelectric component and/or the elastic element are located in the resonator to drive the movable element in two opposite directions using the resonator at the lower and upper frequency of operation ($f_1$, $f_2$), wherein the upper frequency of operation is no larger than 1.5 times the lower frequency of operation.

The frequencies of operation preferably are smaller than one half of the frequency that is calculated as the wave propagation speed for longitudinal waves of the resonator material divided by the largest resonator dimension.

The resonator of the piezoelectric motor is suspended from an elastic element that preferably also drivingly urges the resonator contacting portion against the movable element. If the resonator comprises a preferably symmetric, elongated shape and if the elastic element is configured not to interfere with resonator vibrations (e.g., by connecting the elastic element in a vibration node of the resonator or by selecting a sufficiently resilient elastic element, then the resonator exhibits a longitudinal vibration mode with a frequency that is approximately calculated as the wave propagation speed for longitudinal waves of the resonator material divided by the length of the resonator's elongated shape. Prior art motors having resonators with elongated shapes employ this particular, purely longitudinal mode of the resonator for moving the movable element. It is therefore unexpected and surprising that a piezoelectric motor comprising an elongated resonator would exhibit not only one but two frequencies of operation ($f_1$, $f_2$) that each are less than one half than the frequency calculated as the wave propagation speed for longitudinal waves of the resonator material divided by the length of the resonator's elongated shape.

A method for configuring such a piezoelectric motor comprises starting with a combination of piezoelectric component and resonator that each are symmetrical and together are arranged in a symmetrical fashion such that the combination exhibits only longitudinal vibrations when the piezoelectric component is excited to vibrate by an electric signal. The resonator is preferably symmetric about two perpendicular planes intersecting along the longitudinal axis of the resonator (e.g., axis B-B in FIG. 1d). The method further involves one or both of the following two steps. The first step involves breaking the symmetry of the piezoelectric component and resonator combination by shifting the piezoelectric component away from a plane of symmetry of the resonator. The second step involves introducing asymmetries into the contact surfaces between the piezoelectric component and the resonator.

There is thus provided a piezoelectric motor comprising a resonator and a piezoelectric component connected to the resonator, the resonator comprising a contact portion for drivingly engaging a movable element during use of the piezoelectric motor, wherein the piezoelectric motor moves the movable element in a first direction when a sinusoidal signal of frequency $f_1$ is applied to the piezoelectric component, and further moves the movable element in a second, different, preferably opposite direction when a sinusoidal signal of frequency $f_2$ is applied to the piezoelectric component, wherein the resonator has an elongated shape and wherein both frequencies of operation $f_1$ and $f_2$ are smaller than one half of a frequency that is calculated as the wave propagation speed for longitudinal waves of the resonator material divided by the length of the elongated shape. The larger of $f_1$ and $f_2$ is preferably no larger than 1.5 times the lower of $f_1$ and $f_2$.

The resonator preferably comprises two principal surfaces that in essence are mutually parallel and have the same shape and size. In this manner the resonator acquires a two-dimensional form wherein the geometry does not change in a direction that in essence is perpendicular to the plane that is spanned by the principal surfaces.

The principle of two-dimensionality is also satisfied when transitional regions, e.g., edges or corners, are chamfered or rounded due to the manufacturing process, due to the finishing step or due to wear and thus when an insignificant change of the geometry can be determined.

Herein, the principal resonator surfaces are those that are parallel to the plane that is spanned by the principal resonator axes, i.e., by its longitudinal axis and the axis along its width.

Due to the relatively simple, essentially two-dimensional geometric shape of the resonator, it is possible to configure the design-engineering conditions such that the operational properties of the piezoelectric motor can be predetermined with sufficient accuracy. In this manner it is possible to dispense with the finishing step for the piezoelectric motors and to reduce the rejection rate to a minimum. It is further possible to build a motor drive that has small vibration amplitudes and can preferably also be operated outside of its resonance frequencies. The expensive finishing step for the piezoelectric motors thus becomes unnecessary. Furthermore, a broader-spectrum excitation that places fewer requirements on the accuracy of the driver electronics can take place. It was, therefore, extremely surprising when a two-dimensional resonator geometry is used, a piezoelectric motor can be built where a particularly complex control electronics is not needed.

In this manner, the force dependent, principally known shift of the resonance frequencies due to the contact to the movable element can potentially be left unaccounted for in the piezoelectric motor design. In the end, the piezoelectric motor vibrations are preferably nearly independent of the contact between the resonator and the movable element.

In a preferred embodiment, the resonator cross-section is constant along a direction that is perpendicular to the principal surfaces. In this manner, a particularly simple form of two-dimensionality is created, wherein the vibration properties of the piezoelectric motor can be modified particularly easily, for example, by a change of the resonator's thickness. The parameter space is thereby limited in such a way that the mathematical modeling and prediction of the vibration properties of the piezoelectric motor is noticeably facilitated.

There is thus provided a piezoelectric motor comprising a resonator having an elongated shape, wherein the resonator has a lateral axis along which all resonator cross-sections are the same with the possible exception of chamfered or rounded fringes.

In a preferred embodiment, the piezoelectric component has a monolithic structure. In a particularly preferred embodiment, this monolithic piezoelectric ceramics comprises copper electrodes that interlock in a comb-like fashion. Piezoelectric components of this type are described in the German patent application with file number 101 46 704.4. This patent application is also incorporated here by reference and is considered to be part of the disclosure. The ceramics is preferably monolithic.

The movable element may have any shape and may be movable in any direction. For example, a rod-shaped element may be moved forward and backward along its longitudinal axis. Similarly, a circular, movable element can be rotated in a clockwise and a counterclockwise fashion about its axis of rotation. There are also no restrictions regarding the material of the movable element. However, considering the friction forces that are generated over long term at the contact portion between the resonator and the movable element, an advantageous material demonstrates particularly permanent resistance to wear. In an advantageous embodiment, the movable element, therefore, comprises, at least partially, fiber reinforced plastics, preferably plastics that is reinforced with glass spheres, mineral fibers, carbon fibers, and/or glass fibers. Carbon fibers are particularly advantageous because of their combination of high stiffness and electric conductivity, which can be used for position sensing. An apparatus is thus created in a particularly advantageous manner that due to a small mass has equally small inertia.

The vibration properties of the piezoelectric motor depend on the resonator geometry and the shape and location of the clamped piezoelectric component, as well as on how it is suspended. The resonator shape is advantageously selected such that the mechanical impedance, i.e., the frequency-dependent relationship between the relative velocity between contact portion and movable element and the force that is generated there, is sufficiently large. The force that is transmitted to the movable element is preferably of a magnitude that does not essentially influence the resonator vibrations. In this particularly preferred case, the vibrations of the resonator are largely decoupled from the influences due to the contact to the movable element, i.e., they are independent of the movable element that is being used or of the load condition of the piezoelectric motor.

Similarly, the manner in which the piezoelectric component is clamped within the resonator, and the location of the piezoelectric component relative to the resonator, and/or the location of the clamping point relative to the resonator can modify the vibration properties of the resonator. In a preferred embodiment, the clamping of the piezoelectric component within the resonator is such that the piezoelectric component is located eccentrically to at least one symmetry plane of the resonator. The resonator symmetry is hereby deliberately disturbed such that modes of operation are generated that can be classified neither as pure longitudinal modes nor as torsional modes. Such non-pure modes of operation arise also in small piezoelectric motors at low frequencies of operation. There is thus provided the preferred possibility to use the generated vibrations as modes of operation for small piezoelectric motors and/or at low frequencies of operation, whereby two distinct, preferably opposite, directions of motion of the movable element can be caused at two frequencies. Using non-pure vibration modes allows placing the frequencies advantageously close to each other, which pure vibration modes cannot achieve for several directions of motion and which has advantages for control. The symmetry of the piezoelectric motor can also, or in addition, be deliberately disrupted by an elastic element that is placed asymmetrically to the resonator symmetry plane.

These non-pure modes of operation can also be caused by deliberately disturbing the symmetry of the resonator. Therefore the resonator of a piezoelectric motor often comprises no plane of symmetry, nor an axis of symmetry. In a preferred embodiment, the resonator comprises an opening for receiving the piezoelectric component. Herein the symmetry of the resonator is disturbed by the placement of this opening whereby it is advantageous if the side walls that form the opening have different cross-sections over at least a portion of their length. In an exceptionally preferred embodiment, this is achieved by locating the opening within the resonator with a lateral offset from the longitudinal axis.

In a further preferred embodiment, the symmetry of the resonator is disturbed by at least one of side walls that form the opening having cross-sections that are not constant along the longitudinal direction.

Similarly, in a further preferred embodiment of the piezoelectric motor, at least one of the side walls may be not straight, and in particular may be curved or undulating, in the longitudinal direction. Moreover, in a further preferred embodiment, the symmetry of the resonator is disturbed by adding one or more additional masses, or additional stiffeners, or weakened regions. These particularly simple design measures also modify the vibration properties of the resonator in a way that causes advantageous modes of operation that are not classifiable as pure longitudinal, torsion nor bending modes.

The symmetry of the resonator can also be disturbed through the type and location of the clamping of the piezoelectric component within the resonator. In a preferred embodiment, the piezoelectric component is not clamped across the entire width of the opening but only across relatively small contact portions to the resonator. These contact portions are preferably placed asymmetrically to the symmetry plane of the resonator while the piezoelectric component may be placed symmetrically to the symmetry plane of the resonator. In this particularly simple manner, a suspension of the piezoelectric component is created that is asymmetric with respect to the symmetry plane of the resonator, wherein the variation of the clamping is caused by shifting the contact portions that extend from the resonator and/or from the piezoelectric component.

In a preferred embodiment, the resonator comprises only a single contact portion for contacting and drivingly engaging the movable element during use of the piezoelectric motor.

In a preferred embodiment, the piezoelectric motor comprises a single piezoelectric component. In a particularly preferred embodiment, this piezoelectric component comprises two terminals for transmitting one or several electric excitation frequencies to the piezoelectric component. A terminal is considered a continuous electrically conducting region on or within the ceramic material on which the electric potential is externally prescribed.

In a particularly preferred embodiment, the piezoelectric components or the piezoelectric component is/are excited by exactly one signal. In an extremely preferred embodiment, the motor generates macroscopic motion even when it is excited by a sinusoidal or rectangular wave signal. In this preferred manner, a particularly simple construction of the piezoelectric motor is realized wherein even the control electronics has a particularly simple design and wherein macroscopic motion of the movable element is nevertheless achieved. One does not need to elaborately generate the usual, essentially saw-tooth shaped excitation signals.

The movable element can be moved at two distinct frequencies of operation in two distinct directions. In a particularly preferred embodiment, the contact portion hereby vibrates in two different directions. In this manner, one obtains a device that, preferably without the need for guiding the movable element, allows moving the movable element in a forward and a backward direction by changing the frequency of operation.

For this purpose, an embodiment is preferred wherein the resonator portion contacting the movable element vibrates at both frequencies of operation with amplitudes that have the same order of magnitude. In this way it is assured that, without an additional control effort, forward and backward motions of the movable element occur that have the same performance characteristics such as force or velocity.

In a particularly preferred embodiment, these vibrations have amplitudes of 50 nm-50 μm, preferably, 500 nm-20 μm. In an exceptionally preferred embodiment, the vibrations have amplitudes of 1 μm-5 μm. The particularly advantageous use of the vibrations executed by the resonator is thus made possible.

In an advantageous embodiment of the piezoelectric motor, the driving modes of the piezoelectric motor comprise velocity profiles in the contact portion to the movable element that are not parallel for the different directions of motion of the movable element. This arrangement ensures that the modes of operation comprise different orientations at one or several points of the contact portion. As used herein, the orientation of the modes of operation is the spatial, preferred direction of the motion of a material point, e.g., is the semi-axis of an elliptical motion or the tangent to the trajectory at the moment of contact between the resonator and the movable element.

In a particularly advantageous embodiment, the orientations of the modes of operation form an angle of more than 30° and less than 150°, preferably 70° to 100°.

When a sinusoidal electric signal of a selected frequency and voltage amplitude is applied to the piezoelectric component of a piezoelectric motor that is a preferred embodiment, then the electric current flowing in and out of the piezoelectric component is also sinusoidal of that selected frequency but has an amplitude and phase relative to the voltage that depends on the selected frequency. The dependence is a combination of the capacitive, dielectric properties and the piezoelectric properties of the piezoelectric component. The piezoelectric and mechanical properties of the piezoelectric motor cause the amplitude and phase of the electric current to characteristically deviate from the known characteristics of a capacitive element. Near a frequency of operation at which the piezoelectric motor moves the movable element, there is a resonance frequency of the piezoelectric motor that corresponds to a mode of vibration suitable for moving the movable element. Near that frequency of operation, there is also a frequency, here called the anti-resonance, where the amplitude of the electric current noticeably declines below values that are considered purely capacitive behavior and even may vanish. For frequencies in the region of this resonance/anti-resonance pair, the phase of the electric current relative to the phase of the electric voltage dips noticeably from the 90° that are considered pure capacitive behavior. The maximal dip in phase in this region is 30°, preferably more than 45°, and particularly more than 60°.

In a further advantageous embodiment, the movable element is driven at two distinct frequencies, preferably at two resonance frequencies, in two opposite directions. In this case, it is advantageous if the phase between current and voltage declines inside the resonance/anti-resonance pairs that correspond to the resonance frequencies.

Since the piezoelectric component has capacitive properties, it is observed that inside the aforementioned resonance/anti-resonance pairs the amplitude ratio between current and voltage increases essentially linearly with the frequency. Furthermore, due to the capacitive properties, there exists a phase shift between current and voltage of 90°. Close to an excitation frequency that is appropriate for operation, the current first increases more than proportionally as a function of the frequency, then declines to zero, and finally returns to the capacitive behavior.

In a particularly advantageous embodiment, the phase declines by at least 30°, preferably by more than 45°, and particularly by more than 60° inside the resonance/anti-resonance pairs. Moreover, in an exceptionally preferred embodiment, this phase reduction has the same order of magnitude for both resonance/anti-resonance pairs.

The resonator is preferably urged against the movable element by an elastic element, particularly by a spring, and it is preferable to ensure that the resonances of the elastic element, which cause a large portion of the kinetic energy of the piezoelectric motor to be absorbed by the elastic element, lie outside of the frequencies of operation of the piezoelectric motor. In this manner it is ensured that so-called vibration absorption does not occur, i.e., that the resonance frequencies of the elastic element and those of the resonator do not counteract each other. Undesired resonance frequencies of the suspension are thus excluded from the frequency-of-operation ranges.

In a further advantageous embodiment, the largest portion of the deformation energy that is generated during operation of the piezoelectric motor is stored in the resonator at all frequencies of operation. In this case, the resonator effectively serves as energy storage for the piezoelectric motor. The energy portion that is stored in the resonator comprises preferably at least 60%, particularly preferably at least 90%, of the mechanical energy that is generated during operation of the piezoelectric motor.

In a preferred embodiment, at least 30%, preferably at least 60%, particularly preferably at least 90% of the total energy is stored in those parts of the piezoelectric motor that can easily be mass produced. In particular, those are the resonator and the spring. Particularly if the spring is additionally connected to a frame or similar in order to suspend the piezoelectric motor, particularly good energy storage is mainly then provided when the transition from the spring onto the frame is configured to be easily reproducible. By storing the major portion of the energy in the resonator, in the spring and potentially in the frame, one does not need especially precise manufacturing methods for piezoelectric components without disadvantageously affecting the reproducibility of the piezoelectric motor.

The spring that connects the piezoelectric motor to the suspension is preferably a coil spring. In a particularly preferred embodiment, the windings of this coil spring do not touch each other so that the spring dissipates only little energy even when large vibration amplitudes are transmitted from the resonator to the spring. This is preferably further aided by the spring windings having a pitch that is larger than the diameter of the spring wire by an amount that is larger than the expected vibration amplitudes. Equivalently, the spring may preferably be statically preloaded so that the spring windings separate when loaded.

The spring wire may preferably comprise a non-circular cross-section for at least a portion of its length. In this way, an additional safeguard against twisting is achieved with particularly simple means.

In a further preferred embodiment, the mechanical impedances or admittances of the piezoelectric motor in particular at the contact between the resonator and the movable element are sufficiently large so that the resonator vibrations are independent of the size, shape, orientation and motion of the movable element.

In another advantageous embodiment of the piezoelectric motor, the movable element is moved in two opposite directions at two different frequencies of operation ($f_1$, $f_2$), preferably at resonance frequencies, whereby the frequencies of operation lie inside of two frequency intervals ($\Delta f_1$, $\Delta f_2$) that not only have a mutual, minimal distance ($\Delta f$) between the frequencies, but that also lie within a maximal interval width ($\Delta f_{max}$), and that are also within the domain of influence of the electric resonance of a oscillation circuit that is formed by the piezoelectric component and an inductive element such as an inductive coil as part of the control electronics.

Even in view of manufacturing tolerances and the resulting frequency-of-operation variations, this advantageous method ensures that for each desired frequency of operation there is defined an interval ($\Delta f$) within which all series-produced piezoelectric motors having a preferred embodiment comprise exactly one of their frequencies of operation, e.g., comprise only the frequency of operation for moving the movable element forward. Furthermore, when adaptive control electronics is used, which generates a wide-band control signal, it is certain that within a predetermined maximal frequency interval ($\Delta f_{max}$), there is only one frequency of operation that is usable for moving the movable element. The risk of having the same signal excite a wrong resonance or several resonances that act in opposing directions is thus positively suppressed.

The minimal distance of the frequency-of-operation intervals is preferably sufficiently small so that the capacitive, wattless portion of the piezoelectric motor can be compensated using the inductivity of a single inductive element on the control electronics. For both frequencies of operation, the maximal frequency interval ($\Delta f_{max}$) is preferably sufficiently large so that the intervals of both frequencies of operation ($\Delta f_1$, $\Delta f_2$) lie within the resonance domain of influence of a single electrical resonant circuit that is formed from the inductive element of the control electronics and from the capacitive piezoelectric motor. In this manner it is possible to build the control electronics with particularly simple means.

In a particularly preferred embodiment, the control electronics and the piezoelectric motor form a resonant circuit having a frequency $f_e$ that serves as a band rejection filter in the frequency interval between $f_{el}$ and $f_{eh}$. In a particularly preferred embodiment, the motor control is particularly advantageous if the following relationships are met for the individual quantities:

$$f_{el} > 2/3 f_e \text{ and } f_{eh} < 2 f_e.$$

Especially preferred relationships are:

$$f_{el} > 4/5 f_e \text{ and } f_{eh} < 4/3 f_e.$$

In an exceptionally preferred embodiment, the relationships are $$f_{el} > 6/7 f_e \text{ and } f_{eh} < 6/5 f_e.$$

In this manner, piezoelectric motor control can be particularly well tuned while the electric current consumption is particularly low.

In an advantageous embodiment, the following relationships exist between the minimal distance of the frequency-of-operation intervals $\Delta f$ and a frequency of operation $f_1$:

$$0.025 \cdot f_1 \leq \Delta f \leq 1 \cdot f_1 \text{ and preferably}$$

$$0.1 \cdot f_1 \leq \Delta f \leq 0.3 \cdot f_1.$$

In a preferred embodiment, the electromechanical coupling between the piezoelectric component and the resonator vibrations in the respective modes of operation is at least 500 Hz, preferably is more than 2 kHz and particularly preferred is more than 5 kHz. Here, the coupling is the difference between one of the respective resonance frequencies $f_1$ or $f_2$ and the respective, associated anti-resonance frequency $f_1'$ or $f_2'$ that follows the former in the frequency interval.

In a further preferred embodiment, the electric current of the piezoelectric motor within the aforementioned frequency intervals ($\Delta f_1$, $\Delta f_2$) is maximal only at the frequencies of operation. This ensures optimal piezoelectric motor efficiency when the motor is excited by signals that lie inside the predetermined frequency interval.

In a particularly preferred embodiment, the distance between the individual frequency pairs ($f_1$, $f_1'$) and ($f_2$, $f_2'$) is of the same order of magnitude. Close to integer multiples of the frequencies ($f_1$, $f_2$), the resonator in a further preferred embodiment of the piezoelectric motor comprises no resonances, or only resonances having little coupling and/or amplitudes. Thus it is certain that no or only few detrimental influences arise due to the higher harmonics during non-harmonic electric excitation of the piezoelectric motor.

The ratio between the distance between $f_1$ and $f_1'$ and the distance between $f_2$ and $f_2'$ is preferably between 0.25 and 4.

In a further preferred embodiment of the piezoelectric motor, the electromechanical coupling factor (EMCF) of the individual resonance frequencies, particularly of the modes of operation of the piezoelectric motor, is at least 0.01, preferably 0.04, and particularly more than 0.1. Moreover it is advantageous if the coupling factor has the same order of magnitude for both modes of operation.

A further aspect of the invention is a method for manufacturing resonators of a piezoelectric motor. Herein, the preferably essentially two-dimensional resonators are produced, for example, by cutting a profiled, e.g., extruded rod into lengths.

The manufacturing process for the piezoelectric motors is considerably simplified when these resonators are used whose shape is, in essence, variable only in two dimensions. The method offers a high degree of reproducibility of the desired vibration modes as well as a particularly low rejection rate during production.

In an advantageous version of the method, the profiled, preferably extruded rod is cut into lengths orthogonally to the longitudinal axis of the rod. However, in a particularly preferred embodiment of the method, the rod is cut into lengths at an angle α<90° to the longitudinal axis of the rod. One can thus particularly easily manufacture resonators that have an asymmetry with respect to the symmetry plane, that have principal surfaces that do not lie squarely on top of each other, and whose transitions from principal to lateral surfaces are not orthogonal.

Similarly, the resonators may be manufactured by cutting them, preferably by punching them, from a sheet of constant thickness. The cutting, particularly punching, occurs preferably at an angle that is not 90°. In this particularly simple manner, it is possible to mass produce a resonator whose principal surfaces are mutually exactly parallel but whose transitions from principal surfaces to lateral surfaces are preferably not rectangular. In this particularly simple manner it is possible to optimize the production of resonators that comprise non-rectangular transitions from the principal surfaces to the lateral surfaces.

Finally, a further aspect of the invention is a method for exciting the piezoelectric motor using a control electronics that controls the excitation frequency based on the peak electric current and/or the respective phase minimum and/or the phase change as a function of the frequency.

In this method, the control electronics searches an appropriate excitation frequency for the piezoelectric motor using the aforementioned effect that is known as a resonance/anti-resonance pair. In a preferred embodiment of the method, the control electronics generates the excitation frequencies at defined distances from the determined phase minimum.

For piezoelectric motors having multiple directions of motion, the excitation frequencies are preferably selected so that the phase drops by a sufficiently large amount inside the resonance/anti-resonance pairs that correspond to the frequencies of operation.

In the following, the preferred embodiments are explained in more detail using FIGS. 1-14. The figures illustrate only example embodiments of the invention and in no way limit the general inventive thought.

Given the present disclosure, further methods will be apparent to one skilled in the art to implement the above features and advantages, and the features and advantages discussed below. Further, other objects and features of the invention will become apparent from consideration of the following description taken in connection with the accompanying drawings, in which like numbers refer to like parts throughout.

BRIEF DESCRIPTION OF THE DRAWINGS

FIG. 1a shows a top view of a piezoelectric motor, wherein an elastic spring is joined to the resonator;

FIG. 1b shows a side view, cut along the line BB shown in FIG. 1d, of the piezoelectric motor, the motor comprising a press-fit piezoelectric component;

FIG. 1c shows a side view, cut along the line BB shown in FIG. 1d, of the piezoelectric motor without a piezoelectric component;

FIG. 1d shows a bottom view of the piezoelectric motor that is shown in FIG. 1a;

FIG. 1e shows a frontal view of a piezoelectric motor;

FIG. 2a shows a top view of a resonator having recesses for receiving a coil spring and further having a space for clamping a piezoelectric component;

FIG. 2b shows a side view, cut along the line AA shown in FIG. 2a, of a resonator;

FIG. 2c shows a further top view of a resonator;

FIG. 2d shows a magnified view of the recess sketched in FIG. 2a;

FIG. 3 shows a side view of a piezoelectric motor whose resonator is urged against a movable element by way of a coil spring;

FIG. 4a shows a side view of a first coil spring;

FIG. 4b shows a top view of a first coil spring;

FIG. 4c shows a perspective view of a first coil spring;

FIG. 5 shows a perspective view of a second coil spring;

FIG. 6a shows a cut view along the line AA of the coil spring according to FIG. 8d;

FIG. 6b shows a side view of a third coil spring;

FIG. 6c shows a frontal view of a third coil spring;

FIG. 6d shows a top view of a third coil spring;

FIG. 9 shows a side view of the piezoelectric motor for moving a wheel;

FIG. 10 shows a cut view of the piezoelectric motor and a top view of a piezoelectric motor;

FIG. 14 shows various resonator embodiments;

FIG. 15 shows a resonator comprising an opening with protrusions on the end walls of the opening;

FIG. 22b shows a cross-section through a contact surface between the resonator and the piezoelectric component of FIG. 22a;

FIG. 23b shows a cross-section through a contact surface between the resonator and the piezoelectric component of FIG. 23a;

FIG. 29b shows a diagram representation of the spring coil of FIG. 29a.

DETAILED DESCRIPTION OF SPECIFIC EMBODIMENTS

Figure 7:
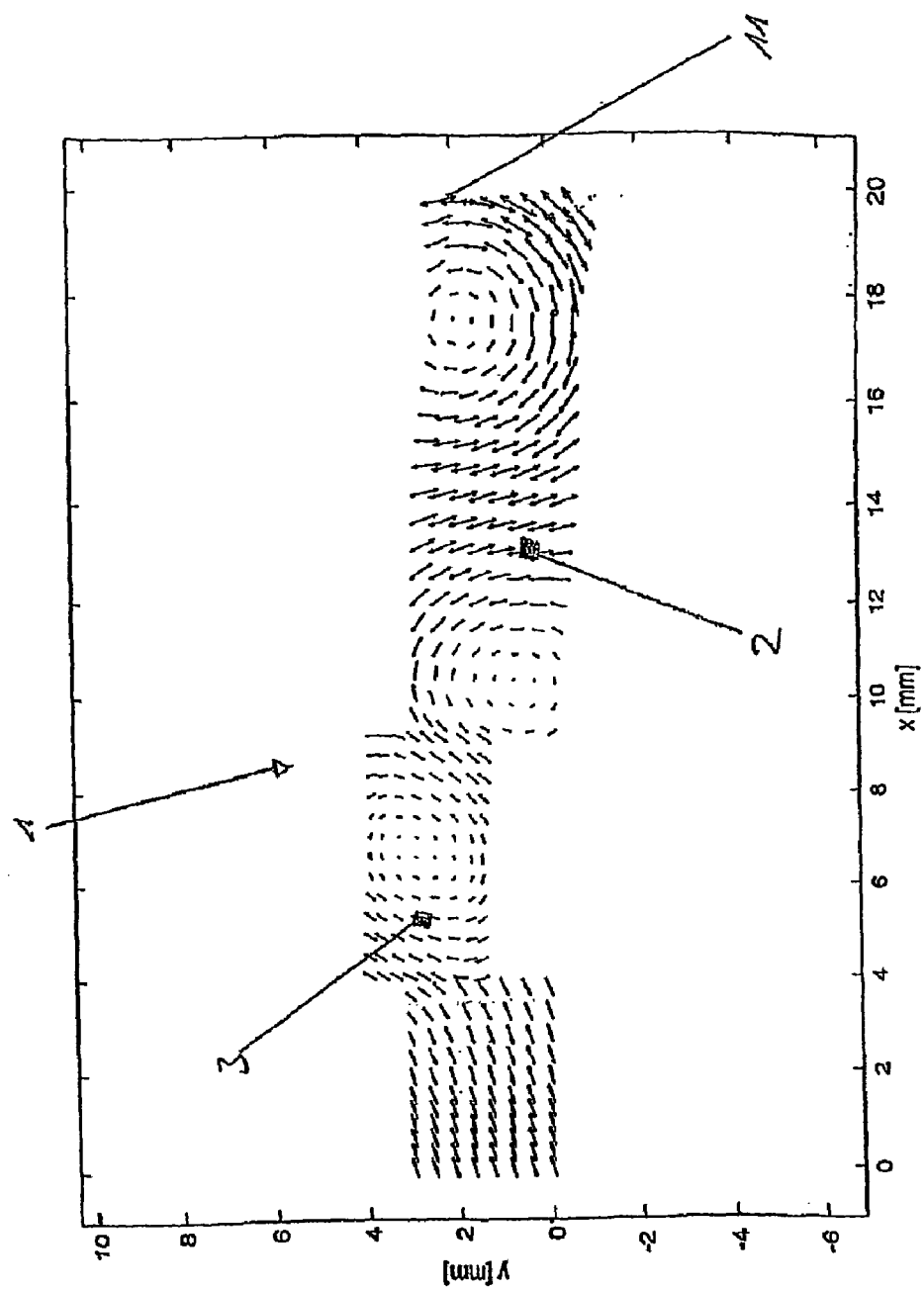
FIG. 7 shows a diagram-type overview of the vibrations performed by individual regions of a resonator, the deflections having x- and y-components during operation of a piezoelectric motor.

FIGS. 1a-1e show various views and sections of a piezoelectric motor 1 comprising a resonator 2 of length LA and a piezoelectric component 3. The depicted resonator 2 comprises two side walls 25, 26 that at least partially have the shape of a circular section. Said side walls 25, 26 have a maximal width LF. The piezoelectric component 3 has width LD, height LC and length LB, and it is preferably clamped into the space 114 in the resonator 2 that is formed by the side walls 25, 26 such that a partial height LE of the piezoelectric component 3 extends above the plane that is spanned by the resonator 2 surface. Furthermore, an elastic element 5 joins the resonator 2 to the base 10. Preferably the elastic element 5 comprises a form-fit spring coil 7 joined to the resonator 2.

FIGS. 2a-2d show a resonator 2 having overall length LA and height LG. The long leg of the resonator 2 that is proximal to the movable element 4 has length L9 and width L5. Furthermore, in the contact portion 11 to the movable element 4 there is provided a circular depression having width L8 whose shape essentially conforms to the surface of the movable element 4 (not shown). Opposite to the side where the resonator 2 clamps the piezoelectric component 3 (not shown), the resonator 2 opening 114 comprises chamfered edges 50 (cf. FIG. 14). Under the rear side of the resonator 2 leg that is distal to the movable element 4 (not shown), there are provided lateral recesses 51, each for receiving one connecting portion 12 of the spring element 7 (not shown). These recesses 51 have a depth L13 and width L17; their center is located at a distance L14 from the end face of the resonator 2. Directly next to the recesses 51 there are provided material bulges 52 with radius R7 on the sides of the resonator 2, the material bulges 52 having a maximal height L16 as measured from the deepest point of the recess 51. When the connecting portions 12 of the elastic element 5 are pressed into the recesses 51, the material bulges 52 support the form-fit of the joint. The recesses 51 are preferably on an exterior surface of a resonator 2, but could be on an interior surface of a cavity, and in particular could be on an interior surface of a cavity formed to receive the piezoelectric element 3.

FIG. 3 shows a piezoelectric motor 1 that is fastened to a base 10 by way of a spring coil 7 and a screw 9, its resonator 2 abutting a movable element 4. During operation of the piezoelectric motor 1, the preferably single contact portion 11 of the resonator 2 executes preferably elliptical or linear vibrations, which cause the movable element 4 to move in a preferably rotary or linear motion. In the example, the contact element 6 is implemented as a contact spring that closes a electrical circuit with the resonator 2 when the wear of the contact portion 1 1 becomes too big.

In FIGS. 4a-4c, various views of a coil spring 7 are shown. The connecting portions 12 of the coil spring 7 that are joined to the resonator 2 (not shown) comprise a modified, preferably not circular, here rectangular (cf. FIG. 6a) cross-section at the connecting portion 12 by which a twist-resistant joint to the resonator 2 can be assured. The windings 15 of the coil spring 7 undergo almost two complete circular revolutions during the transition from one leg of the coils spring 7 to the other. Both legs of the coil spring 7 are connected through two angled leg pieces 14 and a straight bar 13.

FIG. 5 shows a further coil spring 7, which differs from those shown in FIGS. 4a-4c in that the respective legs comprise three almost complete windings 15 and that the bar 13 has essentially the shape of a circular section.

In FIGS. 6a-6d, a third coil spring 7 is shown in several views. This third coil spring 7 also comprises almost three complete windings 15, which, however, are tilted with respect to the plane of the circles. The two legs of the spring are connected through a bar 13 that has essentially the shape of the letter Omega.

The diagram in FIG. 7 illustrates the vibrations that each and every region of the resonator 2 having a clamped piezoelectric component 3 performs during operation of the piezoelectric motor 1 with a first signal at a first frequency. One can clearly observe the distinct local variation of the direction of motion in the contact portion 11.

Figure 8A:
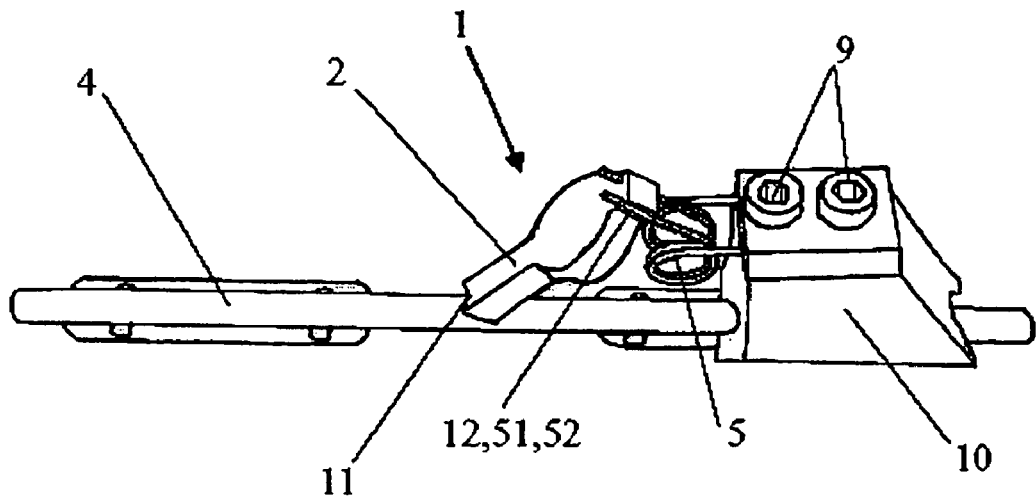
FIG. 8a shows a piezoelectric motor in a linear drive configuration.
Figure 8B:
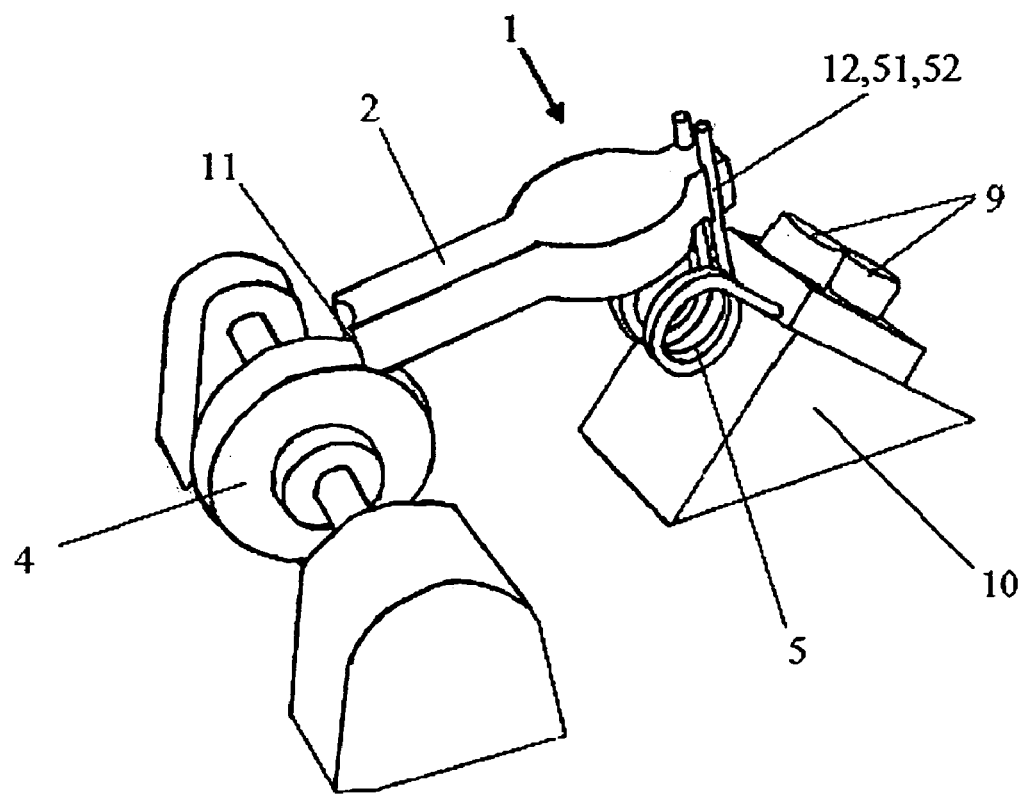
FIG. 8b shows a piezoelectric motor in a rotary drive configuration.

FIGS. 8a and 8b show a piezoelectric motor 1 in driving engagement with a linear and a rotary movable element 4, respectively. In both cases, the resonator 2 is connected by a coil spring 7 to a base 10. Connecting portions 12 of the spring 7 are fit into recesses 51 of the resonator 2. Spring portions 13, 14 (hidden from view) are fastened to the base 10 by screws 9. The contact portion 11 of the resonator 2 is shown to comprise a cylindrical depression with an edge portion that conforms to the toroidal surface of the movable element 4.

FIG. 9 shows a side view of the piezoelectric motor 1, which interacts with a wheel 4 at the contact portion 11 and which can rotate the wheel 4 in two directions about the axis 105 that is perpendicular to the plane of the view. The piezoelectric motor 1 comprises a resonator 2 having two parallel principal surfaces 106, 107 of equal shape wherein a piezoelectric component 3 (not shown) is located. Also, a spring 7 and a screw 9 engaging an end of the spring 7, connect the resonator 2 to a suggested base 10.

In FIG. 10, a cut view and a top view of the piezoelectric motor 1 are shown. The resonator 2 comprises a plane of symmetry 8. The resonator 2 comprises an opening 114 that is formed by sidewalls 25, 26. A piezoelectric component 3 is clamped within the opening 114 between the contact surfaces 20, 21. Furthermore, the resonator 2 is connected to a coil spring 7. The piezoelectric component 3 and the coil spring 7 are configured in such a way with respect to the resonator 2 that the resonator's symmetry is disturbed in a predetermined manner and that the symmetry plane of the piezoelectric motor 1 (not shown) does not coincide with the symmetry plane 8 of the resonator 2.

Figure 11:
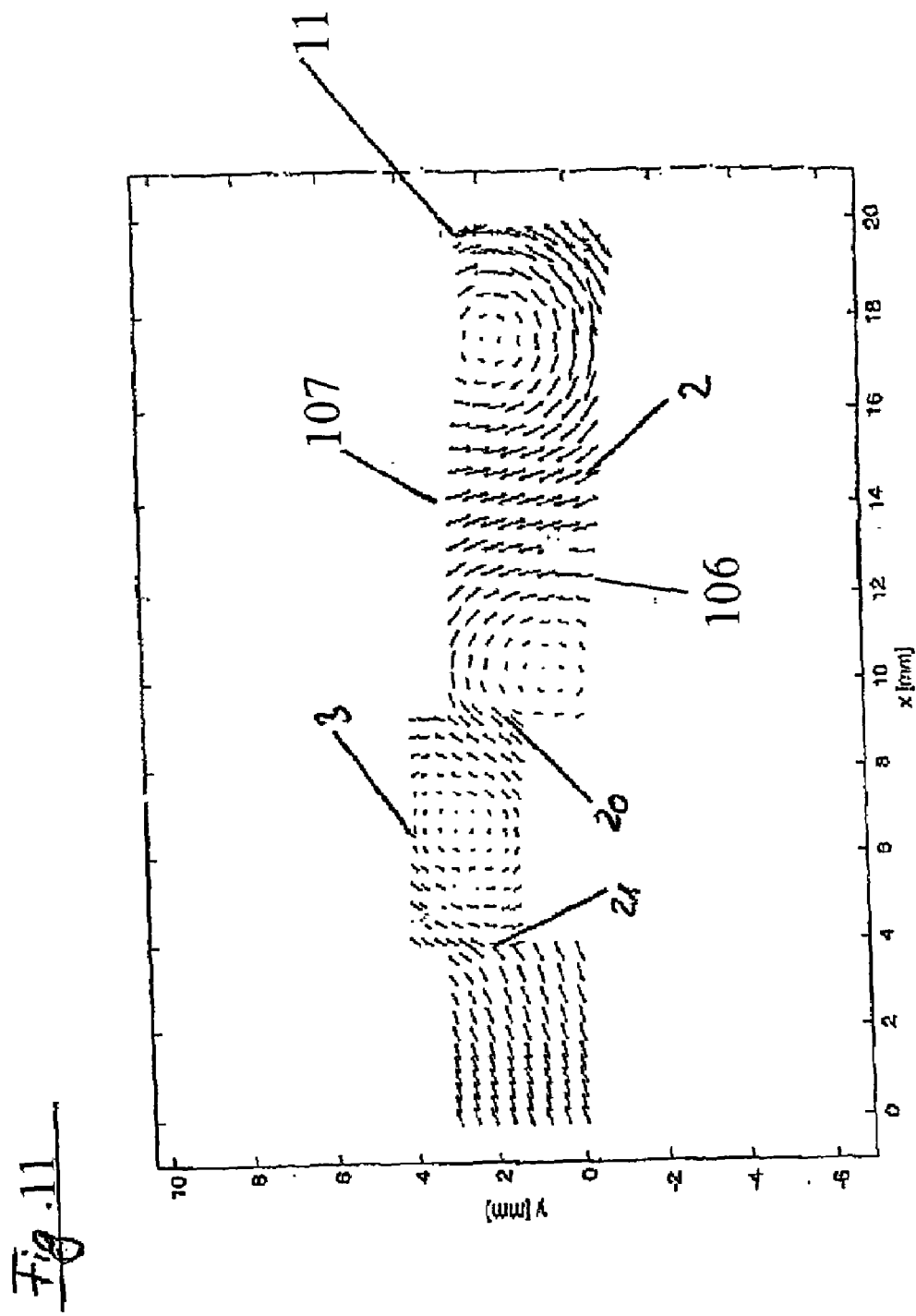
FIG. 11 shows a diagram representation of the vibrations of a resonator and of a piezoelectric component that is held within the resonator.

FIG. 11 illustrates as vectors the vibrations of the individual regions of a resonator 2 and the vibrations of a piezoelectric component 3 that is clamped into the resonator 2. In this illustration, the vectors have an x- and a y-component. The vibration orientation of the individual area elements is determined by the orientation of the vectors; the vector lengths are proportional to the vibration amplitudes. The vibrations of the piezoelectric component 3, which is clamped into the resonator 2, are transmitted through the contact surfaces 20, 21 to the resonator 2. In this embodiment, the piezoelectric component 3 rises above the second principal surface 107 of the resonator 2, and the second principal surface 107 faces the movable element 4 (not shown). Finally, the vibration in the contact portion 11 of the resonator 2 exerts the necessary force for moving the movable element 4 (not shown) while points on the contact portion 11 may move in elliptical paths with major axes that are defined by the orientation of the vectors.

Figure 12:
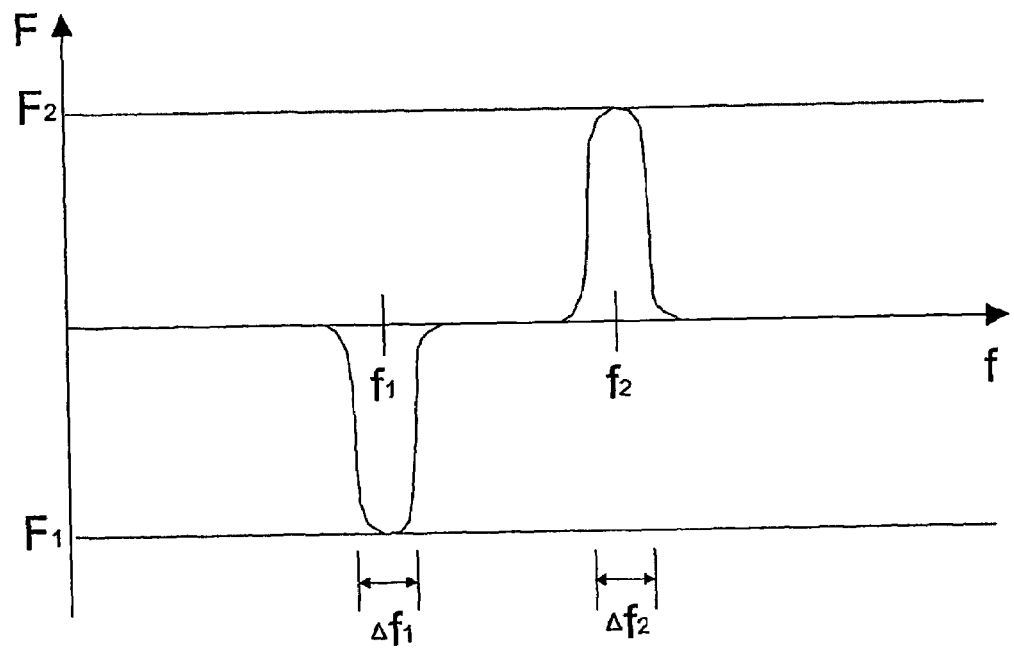
FIG. 12 shows a first graph of the frequency-dependent force of the piezoelectric motor.

The graph in FIG. 12 illustrates how the force F that is exerted by a piezoelectric motor 1 onto a movable element 4 varies with the excitation frequency f. No physical components are shown in this figure. The piezoelectric motor 1 is configured such that it causes a motion of the movable element 4 with a maximal force of magnitude $F_1$ at the frequency $f_1$ within a frequency interval $\Delta f_1$. Furthermore, the piezoelectric motor 1 causes a motion of the movable element 4 in the opposite direction within a frequency interval $\Delta f_2$ and exerts a maximal force of magnitude $F2$ at the frequency $f_2$. In a preferred embodiment, the frequency $f_1$ is about 83 kHz and the range $\Delta f_1$ extends from about 80 kHz to about 89 kHz for a range of about 8-10 kHz. In this preferred embodiment, the frequency $f_2$ is about 97 kHz and the range $\Delta f_2$ extends from about 96 kHz to about 101 kHz for a range of about 4-7 kHz.

Figure 13:
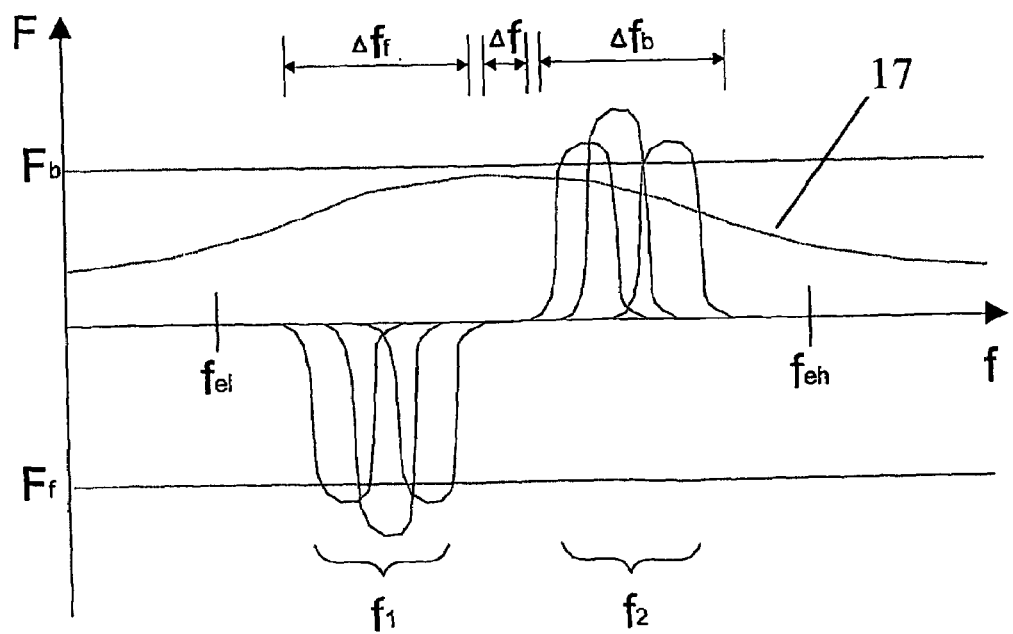
FIG. 13 shows various graphs of the force of a piezoelectric motor at various frequencies of operation.

FIG. 13 illustrates various graphs of the force F of a piezoelectric motor 1 at various frequencies of operation f. The illustration indicates schematically that when the piezoelectric motors 1 are produced in series, variations of the moving forces F occur due to associated production variations; the variations either occur at differing frequencies f or with differing maxima F. As a general rule however, the piezoelectric motors 1 that are built and deemed functional comprise a frequency of operation that lies inside the frequency interval $\Delta f_1$. In this range of frequencies, the piezoelectric motors 1 must generate driving force in a first direction at least at one frequency that lies within that range such that this driving force has a magnitude of more than $F_f$. Furthermore, the motors must comprise another frequency of operation inside another frequency interval $\Delta f_b$ where driving force is generated in a second direction that is preferably opposite to the first direction. In addition, this driving force must have a magnitude that is larger than or equal to $F_b$. Preferably none of the series-produced piezoelectric motors 1 generates driving force in the second direction in the first frequency range. Analogously, no piezoelectric motor 1 generates driving force in the first direction in the second frequency range. It is therefore possible to configure the control electronics to output a wide-band signal having a frequency interval $\Delta f_f$ or $\Delta f_b$, respectively, such that still no piezoelectric motor 1 is excited to cause motion in the opposite direction. These frequencies may be implemented as a mix of frequencies, as a sequence of frequencies or as a mix of these two techniques. Moreover, the piezoelectric motors 1 are configured such that the frequency intervals $\Delta f_f$ and $\Delta f_b$ lie within the domain of influence of a resonant circuit that serves as a band rejection filter. This resonant circuit is preferably formed from a single inductive element 157 in the control electronics and the electric capacity of the piezoelectric motor 1. The characteristic curve 17 in FIG. 13 indicates the frequency dependent characteristics of the AC impedance of a resonant circuit that serves as a band rejection filter at the frequency $f_e$ in the interval from $f_{el}$ to $f_{eh}$.

The curve 17 reflects the admittance (the inverse of impedance or resistance) of the resonator circuit used to drive the piezoelectric element 3. The driving signal to the piezoelectric component 3 from the resonator circuit is advantageously such that the admittance is at or near a maximum somewhere between $f_{el}$ and $f_{eh}$, and preferably somewhere within or very near $\Delta f$. Moreover, the admittance is preferably increasing with frequency during $\Delta f_f$ and decreasing during $\Delta f_b$. For the above described preferred embodiment, the $\Delta f_f$ extends from about 73 kHz to 84 kHz with the peak typically at about 79 kHz, so the width of $\Delta f_f$ is about 10-12 kHz. The preferred frequencies in the range $\Delta f_b$ are from about 91 kHz to about 108 kHz, with the maximum typically at about 97 kHz, with the $\Delta f_b$ extending over a range of about 16-18 kHz. The $\Delta f$ corresponding to these preferred values of $\Delta f_f$ and $\Delta f_b$ is about 7 kHz. The two frequency intervals ($\Delta f_1$, $\Delta f_2$) not only have a mutual, minimal distance ($\Delta_f$) between the frequencies, but that also lie within a maximal interval width ($\Delta f_{max}$), which in this preferred embodiment is at least 27 kHz or at least $\Delta f_f + \Delta f_b +$ $\Delta f$. For this preferred embodiment the thresholds of $f_{el}$ and $f_{eh}$ are preferably at about ½ the maximum admittance, and less preferably at about ⅓ the maximum admittance. The thresholds $f_{el}$ and $f_{eh}$ reflect the preferred domain of influence of the resonance circuit driving the piezoelectric element 3 As partially seen in FIG. 13, the magnitude of the admittance changes or varies (preferably increasing) by 25% to 40% during $\Delta f_f$ and changes or varies (preferably decreasing) by about 25% to 40% during $\Delta f_b$.

Figure 17A:
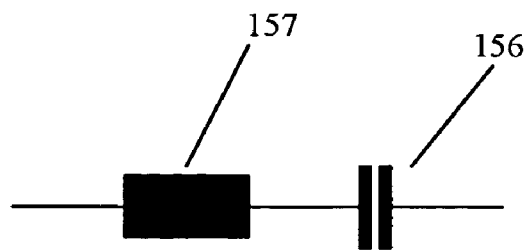
FIGS. 17a-17c show electric circuit diagrams of piezoelectric motor control embodiments that comprise an inductive element.
Figure 17B:
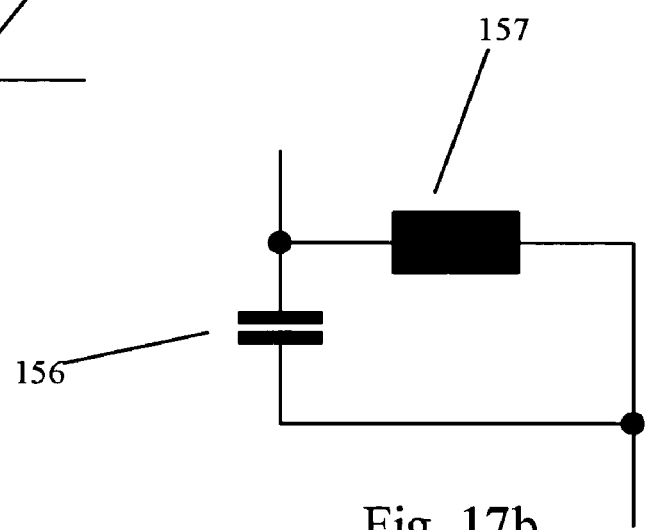
Figure 17C:
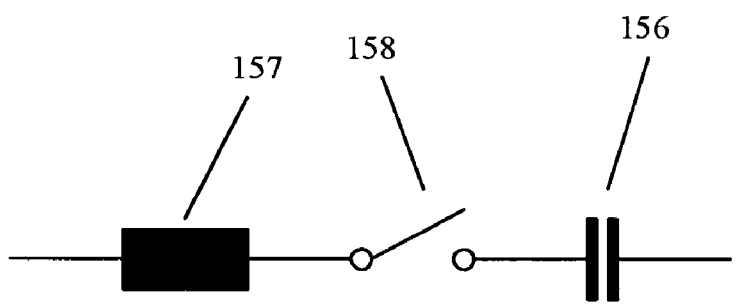

FIGS. 17a-17c are example diagrams of portions of a piezoelectric motor 1 control electronics comprising preferably a single inductive element 157. FIG. 17a shows an inductive element 157 connected in series to the circuit diagram representation 156 of the piezoelectric component 3. FIG. 17b shows an inductive element 157 connected in parallel to the circuit diagram representation 156 of the piezoelectric component 3. FIG. 17c shows an inductive element 157 connected in series to the circuit diagram representation 156 of the piezoelectric component 3 with a switching element 158 interposed between the inductive element 157 and the circuit diagram representation 156 of the piezoelectric component 3.

Examples of alternative resonator 2 shapes are shown in FIG. 14. In particular, notches 109 can be added to positively influence the vibration characteristics and the manufacture of the piezoelectric motor 1.

FIG. 15 shows two views of a resonator 2 that comprises end walls 231 having protrusions 207 for providing the first and/or second contact surface 21 or 22, respectively, in between which the piezoelectric component 3 gets installed. In the present case, the protrusions 207 are created by removing the material surrounding the protrusions 207.

Figure 16A:
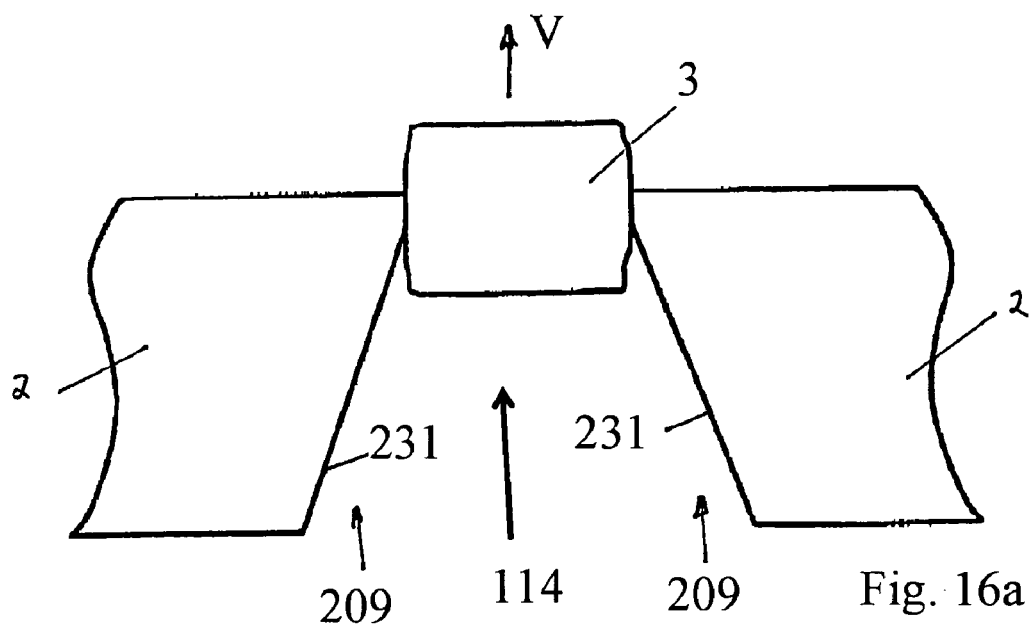
FIGS. 16a-16c show various embodiments of the end walls of the resonator opening.
Figure 16B:
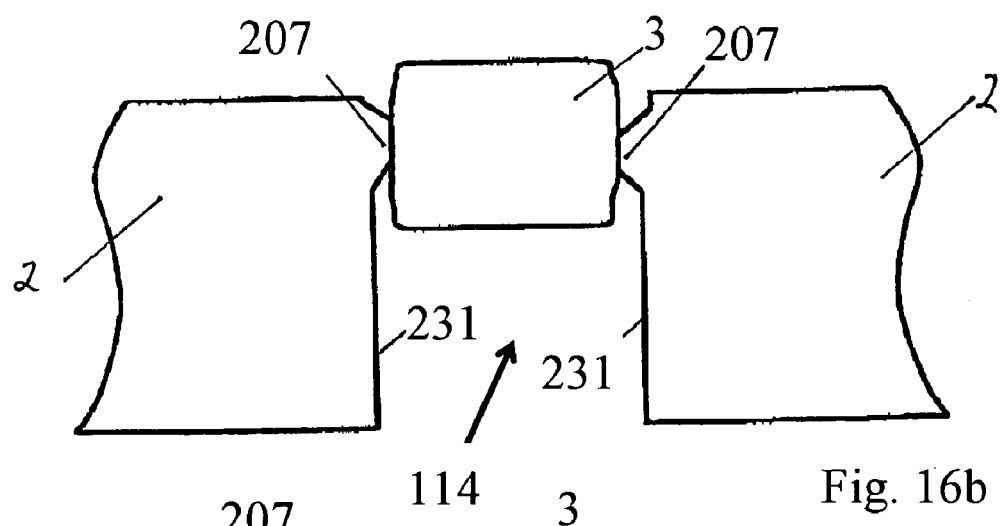
Figure 16C:
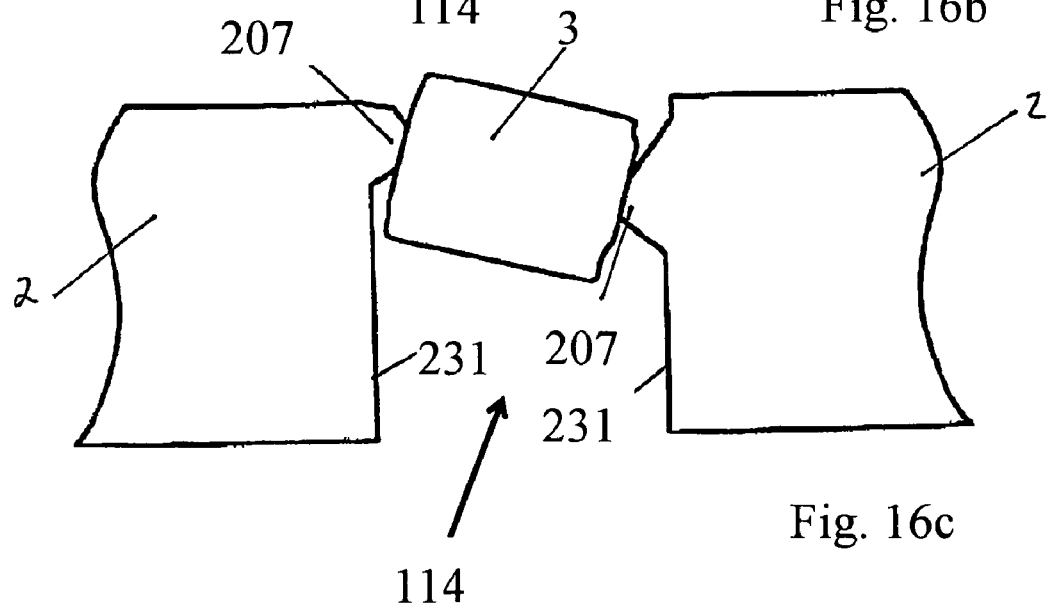

FIGS. 16a-16c show three further possible configurations of the resonator opening 114 end walls 231 that are possible. In FIG. 16a, the end walls 231 each comprise an inclination 209 that facilitates the installation of the piezoelectric component 3. For assembly, the piezoelectric component 3 is pushed up into the resonator 2 from below, which is indicated by the arrow V. FIG. 16b shows a resonator 2 comprising two protrusions 207. The protrusions 207 are mutually offset in the vertical direction so that the protrusion 207 on the left is located higher than the protrusion 207 on the right. Correspondingly, different points of contact result on the piezoelectric component 3. However, the piezoelectric component 3 is horizontal. FIG. 91c corresponds essentially to the embodiment according to FIG. 16b with the exception that in this example the piezoelectric element 3 is not horizontal.

FIGS. 18a, 18b, 19a and 19b illustrate a method for configuring a piezoelectric motor 1 to have modes of vibrations that are neither pure bending vibrations nor pure longitudinal vibrations, and to exhibit preferably two frequencies of operation ($f_1$, $f_2$) for driving a movable element 4 in two preferably opposite directions. This movement of the resonator 2 advantageously causes the contacting portion on the resonator 2 which abuts and drives a movable element to move in a manner suitable to drive the movable element. Preferably the motion is elliptical, but need not be such. The method configures results in frequencies of operation ($f_1$, $f_2$) that are smaller than one half of the frequency that is calculated as the wave propagation speed for longitudinal waves along a longitudinal axis 80 of the resonator 2 material divided by the resonator 2 dimension along that longitudinal axis 80.

Figure 18A:
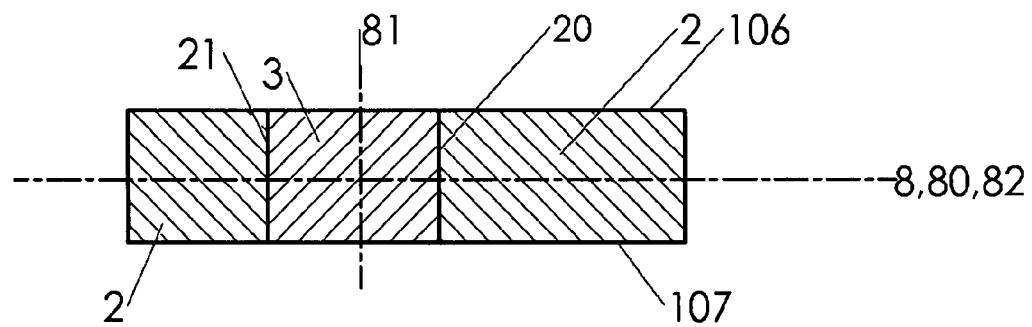
FIG. 18a shows an embodiment comprising a symmetric resonator and a symmetric piezoelectric component arranged symmetrically with respect to the resonator.

FIG. 18a shows a cross-section of an elongated, symmetric resonator 2 holding a symmetric piezoelectric component 3 between contact surfaces 20, 21. The resonator 2 has a horizontal plane of symmetry 8 comprising a longitudinal axis 80 of the resonator 2 which is formed by the intersection of the horizontal symmetry plane 8 and a vertical symmetry plane 83 that is perpendicular to the horizontal symmetry plane 8. The terms horizontal and vertical are used to identify the different planes in the figures and do not necessarily refer to the orientation of the piezoelectric motor 1 during use of the piezoelectric motor 1. The combination of the piezoelectric component 3 and the resonator 2 is also symmetric, i.e., the longitudinal resonator axis 80 is coaxial with the longitudinal center axis 82 of the piezoelectric component.

Figure 19A:
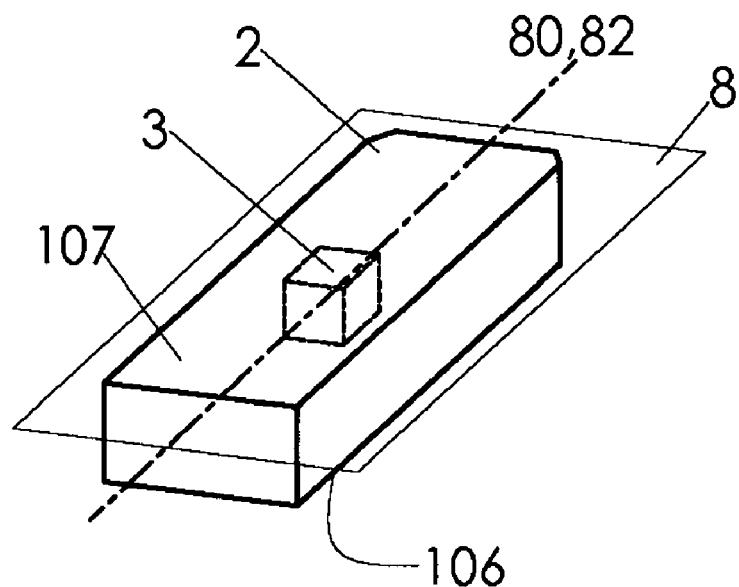
FIG. 19a shows an embodiment comprising a symmetric resonator and a symmetric piezoelectric component arranged symmetrically with respect to the resonator.

FIG. 19a shows a perspective view of an embodiment having a cross-section like that shown if FIG. 18a. The FIGS. 18a and 19a also shows that the symmetric resonator 2 does not necessarily need to have the shape of a parallelepiped, but that it can be prismatic, i.e., have two principal surfaces 106, 107 that are parallel to, and at equal distance to, the horizontal symmetry plane 8, the prismatic resonator 2 having straight edges connecting the principal surfaces 106, 107, these edges being parallel to a vertical axis 81 that is perpendicular to the horizontal plane 8.

The symmetric combination of resonator 2 and piezoelectric component 3 of FIGS. 18a, 19a is configured to exhibit purely longitudinal vibrations when the piezoelectric component 3 is excited to vibrate along its longitudinal center axis 82.

Figure 18B:
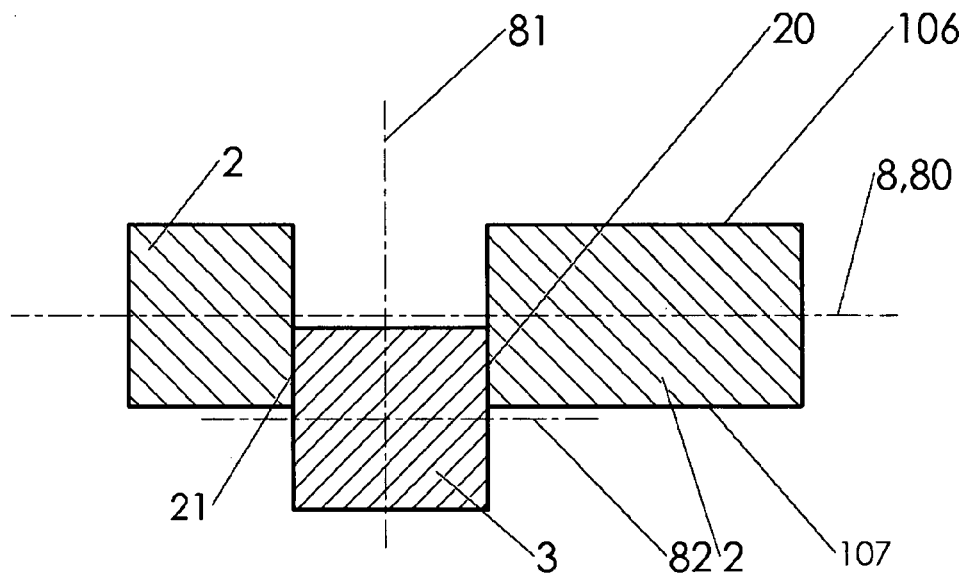
FIG. 18b shows an embodiment comprising a symmetric resonator and a asymmetric piezoelectric component arranged symmetrically with respect to the resonator.
Figure 19B:
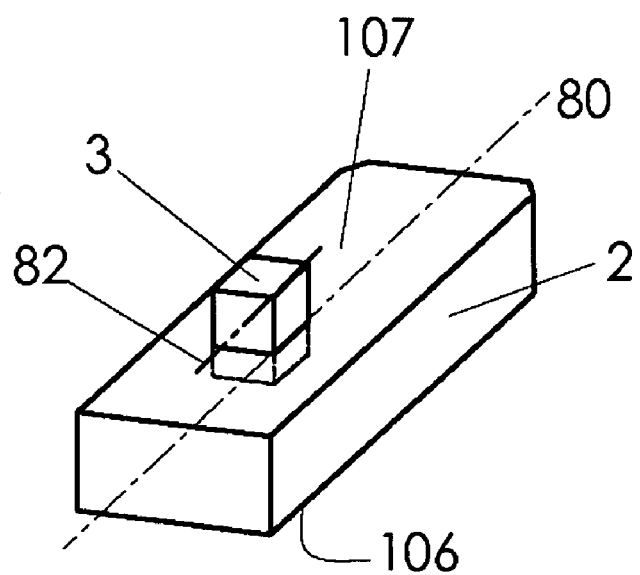
FIG. 19b shows an embodiment comprising a symmetric resonator and a asymmetric piezoelectric component arranged symmetrically with respect to the resonator.

The embodiments of FIGS. 18b and 19b show an asymmetric combination of resonator 2 and piezoelectric component 3 wherein the piezoelectric component 3 has been shifted along the vertical axis 81 so that the longitudinal center axis 82 of the piezoelectric component 3 does not lie in the plane of symmetry 8 of the resonator 2. This shift causes an asymmetric mass distribution and asymmetric contact surfaces 20, 21, which modifies the longitudinal mode having a resonance frequency that is approximately calculated as the wave propagation speed for longitudinal waves along a longitudinal axis 80 of the resonator 2 material divided by the resonator 2 dimension along that longitudinal axis 80. The modified longitudinal mode preferably comprises two different modes, each having a resonance frequency that is less than half of the resonance frequency of the unmodified mode and neither being a pure longitudinal mode nor a pure bending mode, but being a combination thereof. These modified modes preferably comprise the modes of operation of the piezoelectric motor 1 for moving a movable element 4 in two preferably opposite directions during use of the piezoelectric motor 1.

For a preferred embodiment where the height of the resonator 2 is 3 mm, the piezoelectric element 3 is offset about 1.2 mm toward the surface of the resonator, so the axis 82 is about 90% of the way toward the exterior surface of the resonator 2. The center axis of the piezoelectric component 3 could be outside the exterior surface or profile of the resonator 2 as indicated in FIG. 18b, but it is preferably at or within about 10-25% of the exterior surface of the resonator. This offset produces not only an asymmetric mass, but the force exerted by the piezoelectric component 3 on the resonator is also offset from the axis of the resonator 2. The closer the centerline of that force from the piezoelectric component 3 gets to the exterior surface of the resonator 2, the greater the bending moment exerted on the resonator.

Figure 20A:
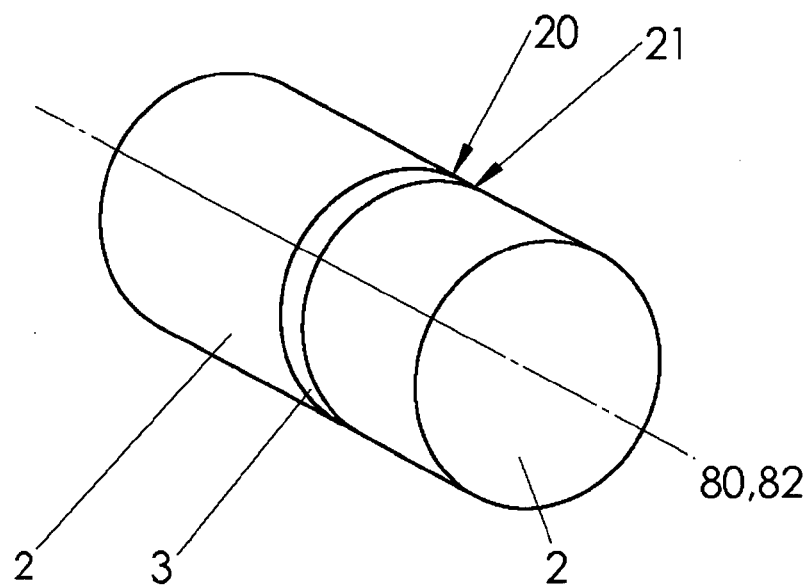
FIG. 20a shows an embodiment comprising a symmetric resonator and a symmetric piezoelectric component arranged symmetrically with respect to the resonator.
Figure 20B:
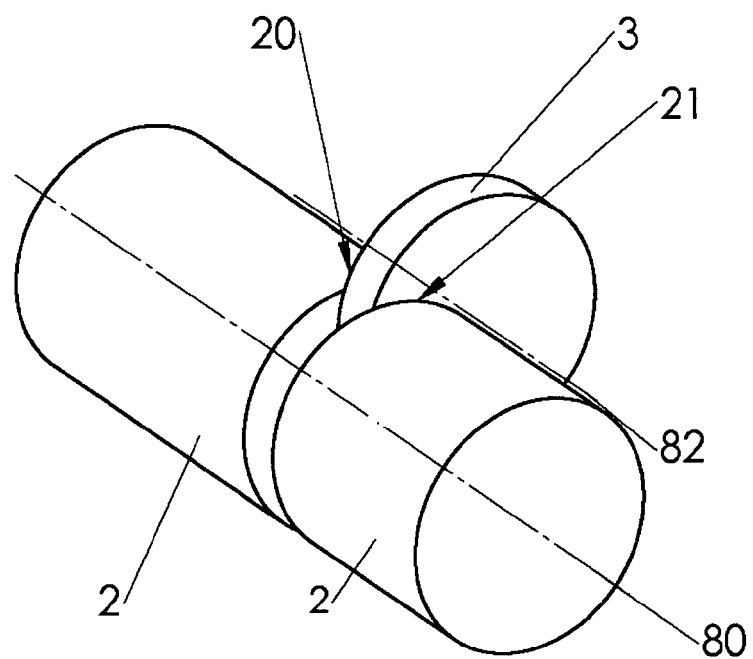
FIG. 20b shows an embodiment comprising a symmetric resonator and a asymmetric piezoelectric component arranged symmetrically with respect to the resonator.

FIG. 20a and 20b illustrate a method for configuring a piezoelectric motor 1 that parallels the method illustrated by FIG. 18a, 18b and 19a, 19b. In this method, piezoelectric motor 1 comprising an axisymmetric, cylindrical resonator 2 holding an axisymmetric, cylindrical piezoelectric component 3 preferably between two portions of the resonator 2 is reconfigured by shifting the piezoelectric component 3 away from the longitudinal center axis 80 of the resonator 2 so that the longitudinal center axis 82 of the piezoelectric component 3 is not coaxial with the longitudinal center axis 80 of the resonator 2 anymore. Pure longitudinal or torsional modes are thus coupled with bending components of the resonator 2, which leads to a lowering of the resonance frequencies and to modes of vibrations suitable for causing a contact portion 11 on the resonator 2 to vibrate with sufficient amplitude to move the movable element 4 when an electric signal of appropriate frequency is applied to the piezoelectric component 3.

The embodiment of FIGS. 18, 19 and 20 show the piezoelectric component 3 surfaces flush with the resonator 2 surfaces, but this need not be. As shown in other embodiments of this disclosure, the resonator 2 can comprise openings 114 for holding the piezoelectric component 2 and the piezoelectric component 3.

Figure 21A:
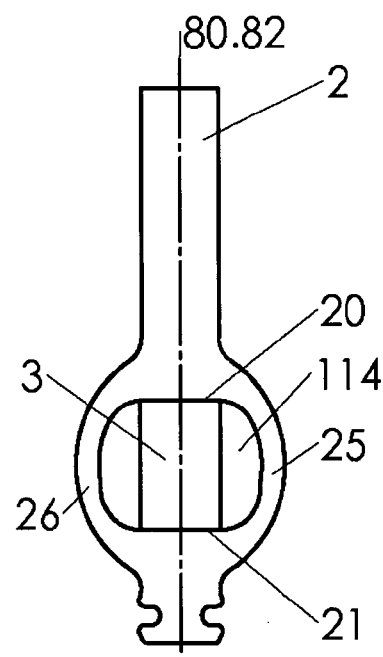
FIG. 21a shows an embodiment comprising a symmetric resonator and a symmetric piezoelectric component arranged symmetrically with respect to the resonator.
Figure 21B:
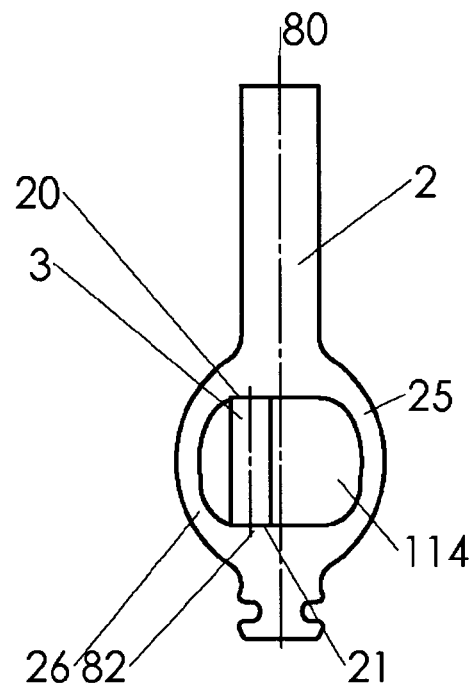
FIG. 21b shows an embodiment comprising a symmetric resonator and a asymmetric piezoelectric component arranged symmetrically with respect to the resonator.

FIGS. 21a and 21b shows a further method for disturbing the combined symmetry of a symmetric resonator 2 and a symmetric piezoelectric component 3 in FIG. 21a by shifting the piezoelectric component 3, preferably within an opening 114 of the resonator 2, in a direction that lies in the plane of symmetry 8 of the resonator 2, which is shown in FIG. 21b.

Figure 22A:
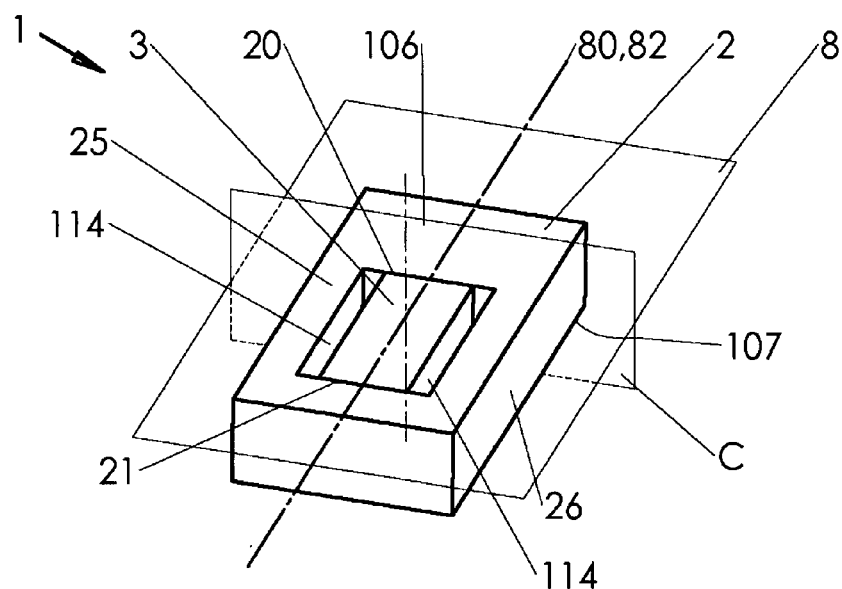
FIG. 22a shows a preferred embodiment comprising a resonator having a piezoelectric component arranged within an opening of the resonator.
Figure 22B:
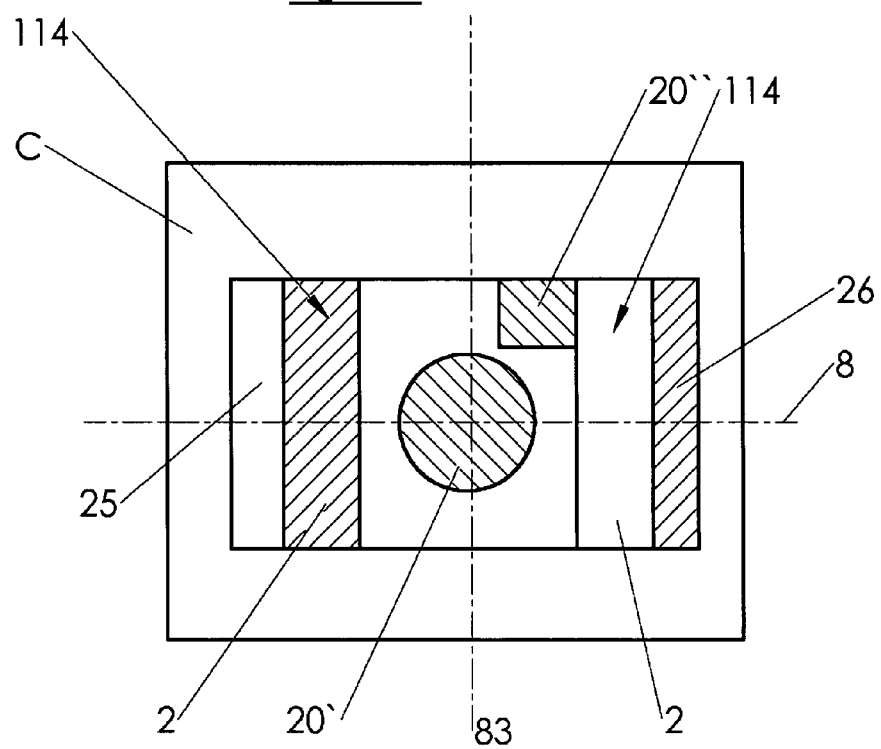

FIG. 22a shows a resonator 2 comprising an opening 114 for holding a piezoelectric component 3 in compression. Both the resonator 2 and the piezoelectric component 3 are symmetric about a symmetry plane 8 and are arranged with respect to each other that their combined embodiment is also symmetric with respect to the same symmetry plane 8. A cut view of the first contact surface 20 of the resonator opening 114 is shown in FIG. 22b. There it can be seen that the contact surface 20 has been configured to not cover the entire potential contact area between the resonator 2 and the piezoelectric component 3. Instead, the contact area covers only a portion of the entire area, is located and/or shaped asymmetrically with respect to the symmetry plane 8 and/or an axis 83 perpendicular thereto, and may also comprise more than one portions, here portions 20' and 20". Due to the asymmetry of the contact surfaces 20, 21 and despite the apparent symmetry of the piezoelectric motor 1 here, the resonator 2 will exhibit modes of vibrations excited by the piezoelectric component 3 that are neither purely bending nor pure longitudinal, but combinations of the two and may be configured to drive a movable element 4 in two or more directions at two or more distinct frequencies.

Figure 23A:
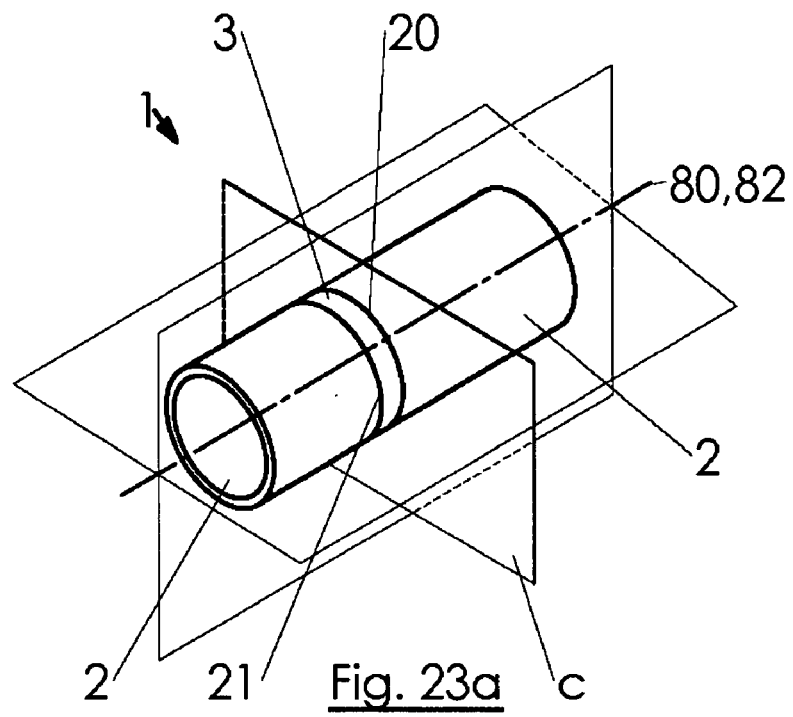
FIG. 23a shows an embodiment comprising a cylindrical resonator having a piezoelectric component arranged within two portions of the resonator.
Figure 23B:
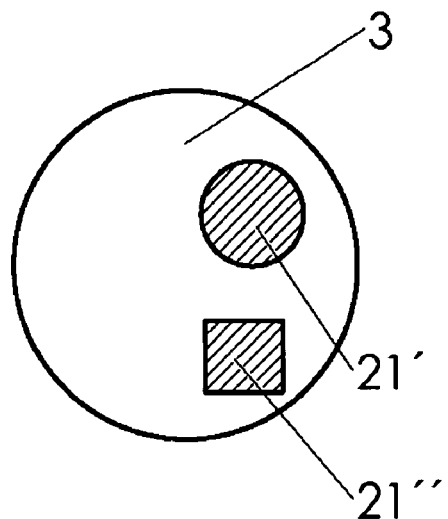

FIG. 23a shows a symmetric, cylindrical piezoelectric motor 1 comprising a symmetric, cylindrical resonator 2 and a symmetric, cylindrical piezoelectric component 3. Similar to the embodiment of FIGS. 22a, 22b, this arrangement will exhibit modes of vibrations that are not of the purely longitudinal or bending type due to asymmetric contact surfaces 21', 21" and/or asymmetric contact surfaces 20', 20".

Figure 24:
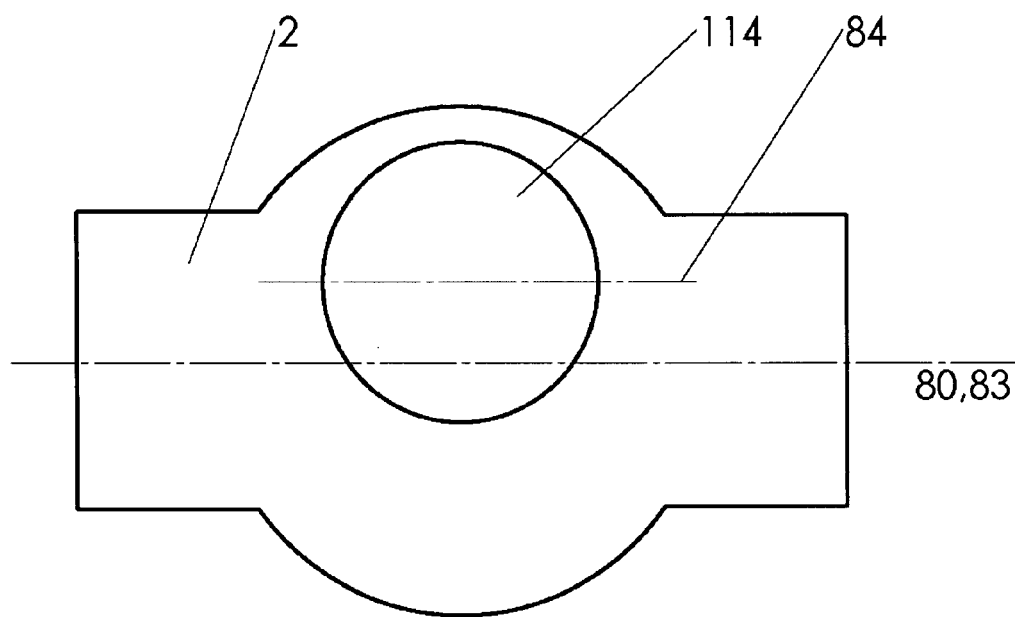
FIG. 24 shows a resonator having an opening.

FIG. 24 shows a resonator 2 that has a symmetric peripheral shape but that has a symmetrically shaped opening 114 located asymmetrically with respect to the vertical symmetry plane 83 of the symmetric periphery of the resonator 2 so that the longitudinal central axis 80 of the resonator 2 periphery is not coaxial with respect to the central axis 84 of the opening 114, the central axis 84 being parallel to the axis 80.

The resonator 2 in FIG. 20 does not need to be cylindrical, but more generally can be a straight prism as long as the symmetry of the unmodified piezoelectric motor 1 is such that it exhibits pure longitudinal or torsional motions. For example, FIG. 26 shows a straight, prismatic resonator 2 having triangular cross-sections with a cylindrical piezoelectric component 3 having a rotational symmetry axis 82 located on the longitudinal axis 80 of the resonator 2. In addition, the piezoelectric component 3 is shown as attached to the resonator 2 and not being located between portions of the resonator 2.

Figure 25A:
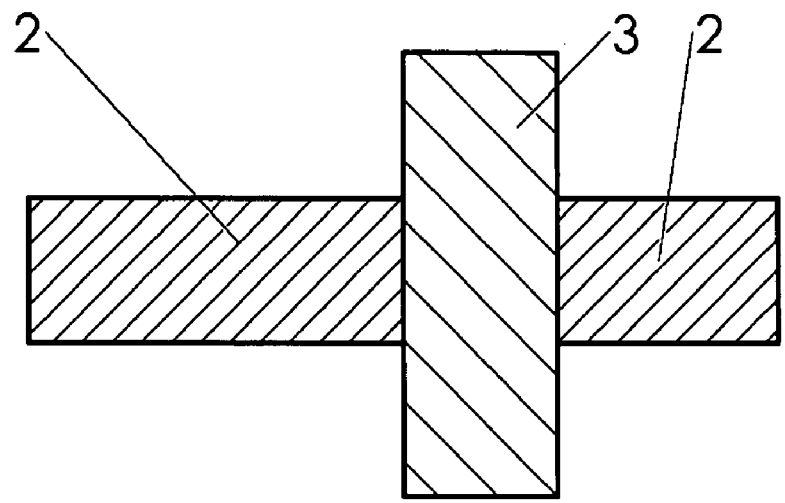
FIGS. 25a and b show cross-sections of a piezoelectric motor comprising a resonator and a piezoelectric component.
Figure 25B:
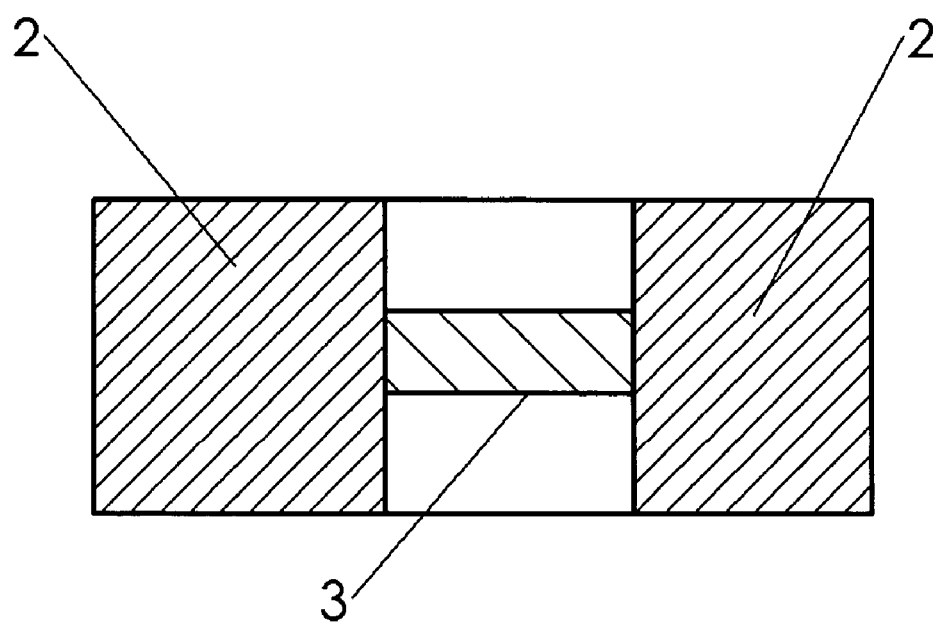

FIG. 25 shows resonator 2 and piezoelectric component 3 cross-sections to illustrate that piezoelectric component 3 dimensions can be larger or smaller that the corresponding resonator 2 dimension.

Figure 26A:
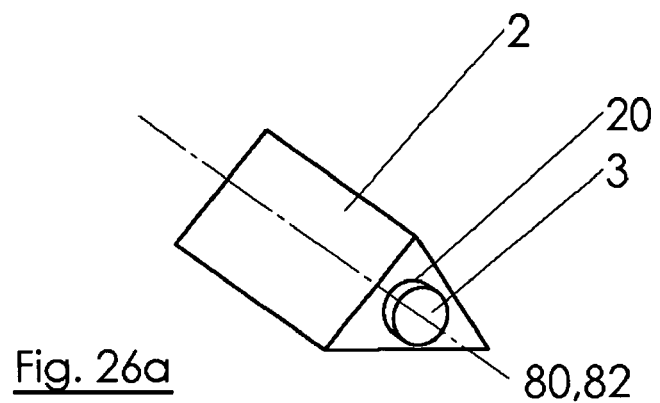
FIGS. 26a-26c show combinations of a resonator and a piezoelectric component embodiments.
Figure 26B:
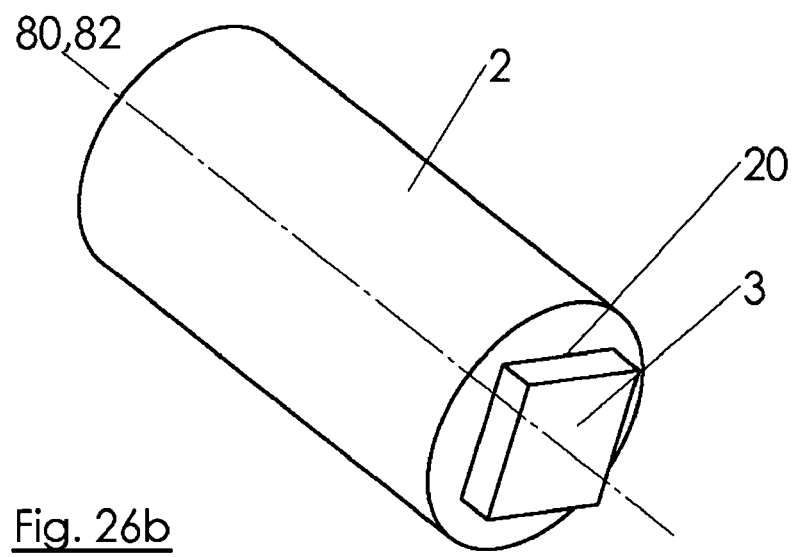
Figure 26C:
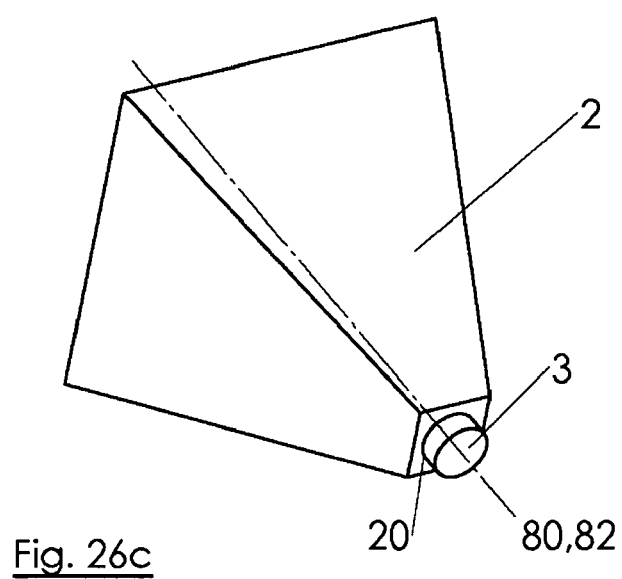

FIGS. 26a-26c show a number of combinations of a piezoelectric component 3 and a resonator 2 that have coaxial longitudinal axes 80, 82 and exhibit pure longitudinal or torsional modes that can be coupled to bending modes by shifting the piezoelectric component 3 along a direction that is perpendicular to the axis 80 or by modifying the contact surfaces 20 and/or 21 to be asymmetric. The embodiment of FIG. 26a combines a round cylindrical piezoelectric component 3 with a triangular straight prism resonator 2. The embodiment of FIG. 26b combines a round cylindrical resonator 2 with parallelepiped piezoelectric component 3. FIG. 26c shows a straight but tapered prism resonator 2. The resonators 2 in FIGS. 26a-26c have different axial symmetries about their respective longitudinal axes 80. The axial symmetry of the resonator 2 in FIG. 26a is such that the resonator 2 can be rotated by plus or minus 60 degrees about the longitudinal axes 80 without being different. The axial symmetry of the resonator 2 in FIG. 26b is such that the resonator 2 can be rotated by any angle about the longitudinal axes 80 without being different. The axial symmetry of the resonator 2 in FIG. 26c is such that the resonator 2 can be rotated by 180 degrees about the longitudinal axes 80 without being different. A variable cross-section of the resonator 2, of the piezoelectric component 3 or both, is used to provide a desired bending mode or modes. The cross-section variation is preferably constant but need not be so.

Figure 27A:
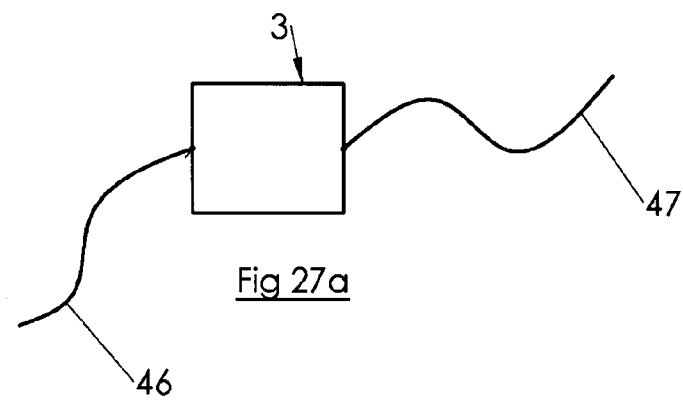
FIGS. 27a-27d show a number of piezoelectric component embodiments having two terminals for applying an electric signal to the piezoelectric component.
Figure 27B:
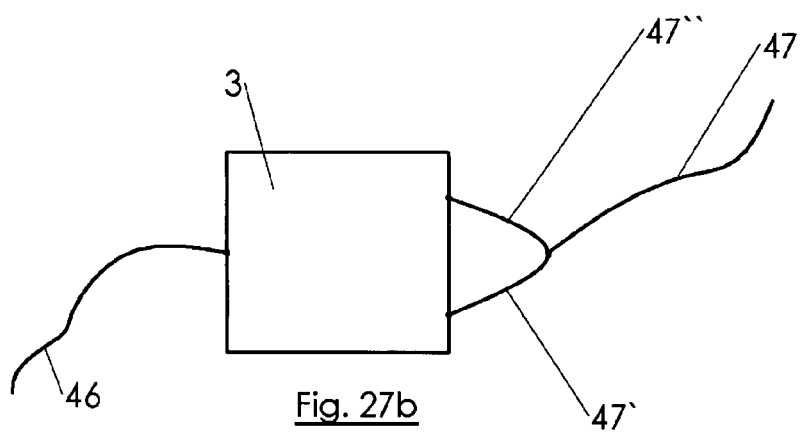
Figure 27C:
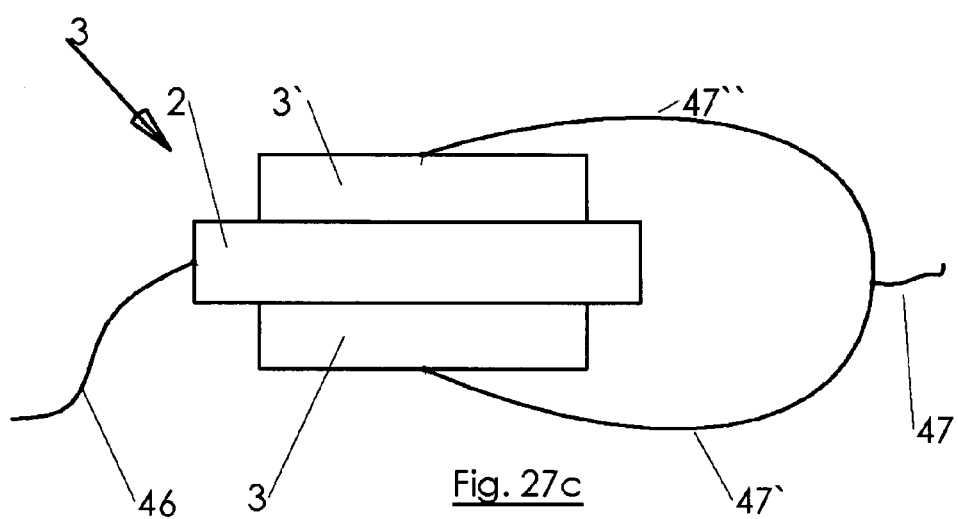
Figure 27D:
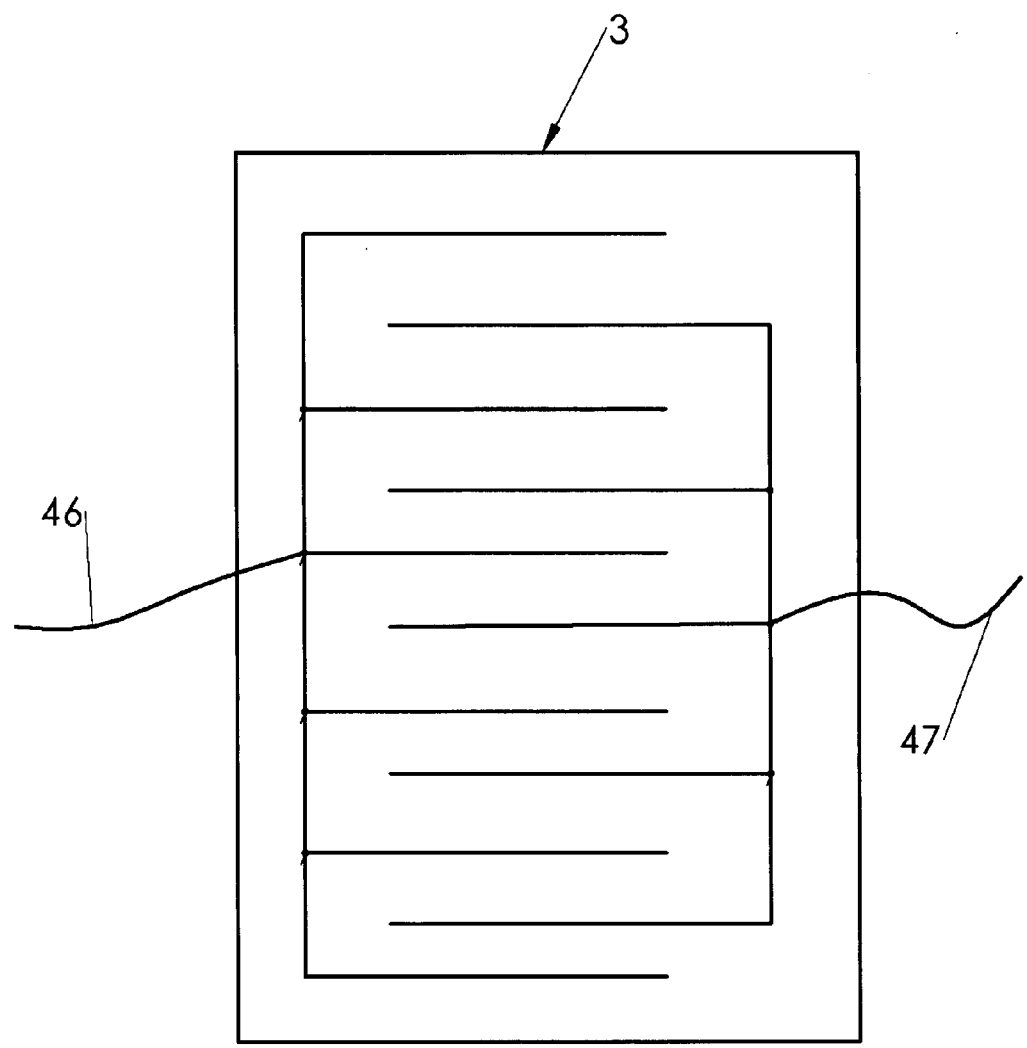

FIGS. 27a-27d show a number of piezoelectric component 3 embodiments having two terminals 46, 47 for applying an electric signal to the piezoelectric component 3. In FIG. 27a, two terminals 46, 47 are shown as connecting wires. FIG. 27b exemplifies the case where there are several connecting wires 47', 47", or more, electrically connected together to a single terminal 47. In this manner, all electric signals to the piezoelectric component 3 can be applied only through these two terminals 46, 47 without physically disconnecting portions 47', 47". FIG. 27c illustrates a piezoelectric component 3 comprising two plate-like parts 3' and 3" that are located parallel to each other and each have a terminal 47', 47", the two terminals 47', 47" being electrically connected together to form a single terminal 47. Each of the parts 3' and 3" is physically and electrically connected to a common electrode, which in this case comprises the resonator 2 itself, which now represents the second terminal 46. FIG. 27d illustrates a multilayered piezoelectric component 3 that has a monolithic construction comprising a piezoelectric ceramic compound that is interposed with two sets of internal electrodes that are arranged in an interlocking comb-like fashion. Each of these two sets of electrodes are electrically connected together to form terminals 46 and 47.

Figure 28:
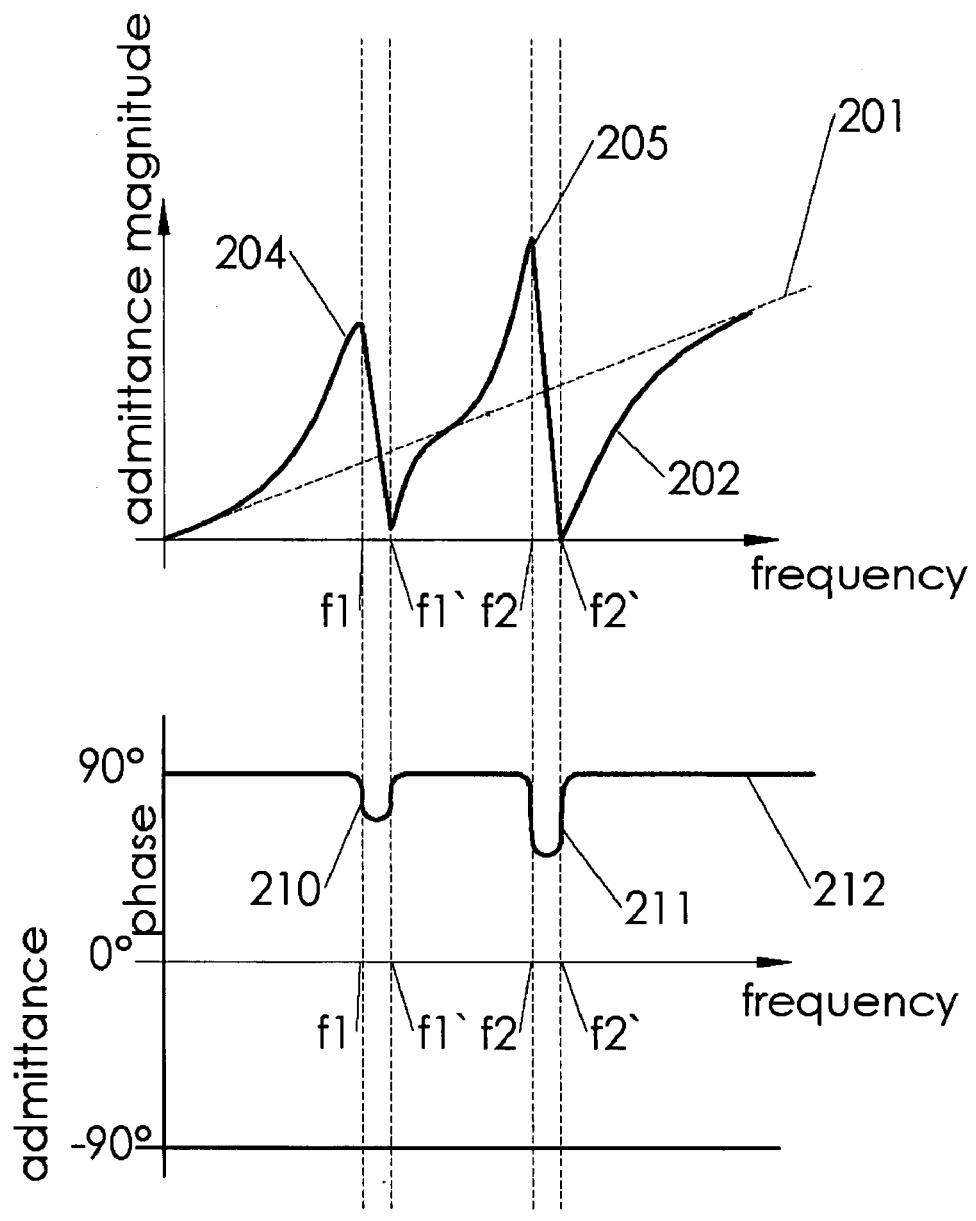
FIG. 28 shows a graph of the frequency dependence of the electric admittance of a piezoelectric motor.

The graphs of FIG. 28 show the magnitude and the phase, respectively, of the electric admittance of the piezoelectric motor 1. The electric admittance is the complex ratio of the current and the voltage of an electric signal that is applied to the piezoelectric component 3 with a given frequency. If the voltage amplitude of this electric signal is constant, the electric admittance represents the electric current. Due to the arrangement of a piezoelectric component 3 with respect to a resonator 2, there are two frequencies $f_1$, $f_2$ where the curve 202 representing the magnitude of the admittance spikes in maxima 204, 205, and there are two frequencies $f_1'$, $f_2'$ where the admittance magnitude curve 202 nearly or completely vanishes. Each of the pairs ($f_1$, $f_1'$) and ($f_2$, $f_2'$) is called a resonance/anti-resonance pair.

A purely capacitive behavior of the piezoelectric motor 1 is represented by a straight, dashed curve 201. In the absence of other effects not considered here, the admittance magnitude curve 202 asymptotically approaches the capacitive curve 201 for very small and very large frequencies.

Figure 29A:
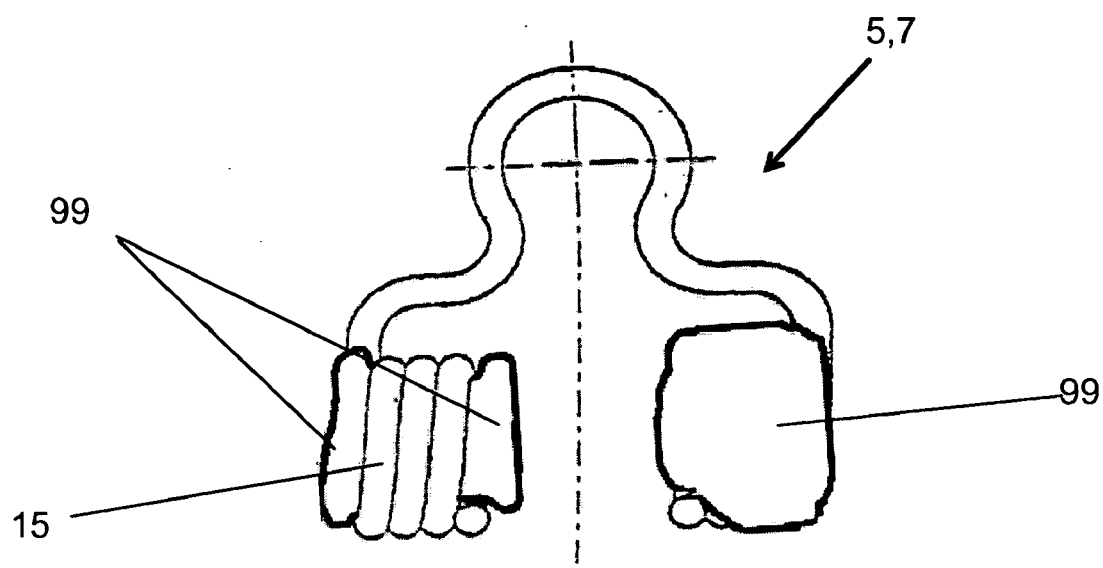
FIG. 29a shows a spring coil with a foamed material in the region of its windings.
Figure 29B:
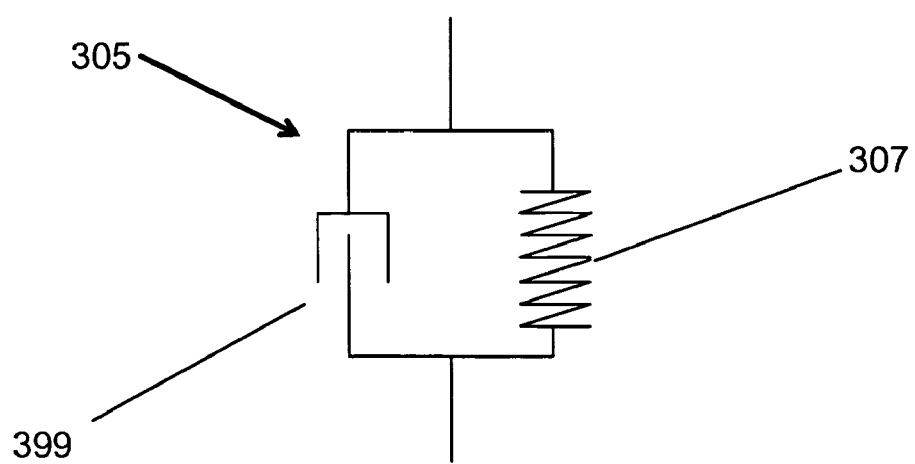

Within either of the frequency pairs ($f_1$, $f_1'$) or ($f_2$, $f_2'$), the admittance phase curve 212 declines (in the absence of other effects not considered here) from the purely capacitive 90 degrees to phase dips 210, 211 by amounts that depend on the difference between $f_1$ and $f_1'$ or between $f_2$ and $f_2'$, respectively. These phase dips 210, 211 also depend on the damping in the system and may, for example, be affected by a foamed material 99 that is inserted into the region of the windings 15 of a coil spring 7 for resiliently urging the piezoelectric motor 1 against a movable element 4. Such a coil spring 7 comprising a foamed material is shown in FIG. 29a. The foamed material 99 may be pressed into the windings 15 or it may cover them completely. FIG. 29b is a diagram representation of an elastic element 5 comprising the coil spring 7 of FIG. 29a, where the foamed material is represented by a dashpot 399 and the coil spring 7 is represented by a spring element 307.

The piezoelectric components 3 are shown contained within an opening of the resonator 2. But the piezoelectric components could be fastened (e.g. adhered) to side walls of the resonator, either aligned or misaligned with the principal axis of the resonator.

The various features of the embodiments can be used alone, or in varying combinations with each other and are not intended to be limited to the specific combination described herein. Thus, the invention is not to be limited by the illustrated embodiments but is to be defined by the claims.

| Partial List of Reference Symbols: | |
|---|---|
| 1 | piezoelectric motor |
| 2 | resonator |
| 3 | piezoelectric component |
| 4 | movable element |
| 5 | elastic element |
| 6 | contact element |
| 7 | coil spring |
| 8 | plane of symmetry of resonator 2 |
| 9 | screw |
| 10 | base |
| 11 | contact portion of the resonator 2 to the movable element 4 |
| 12 | connecting portion of coil spring |
| 13 | straight bar of coil spring 7 |
| 14 | leg pieces of coil spring 7 |
| 15 | coil windings of coil spring 7 |
| 17 | characteristic curve |
| 20 | first contact surface of resonator opening 114 |
| 21 | second contact surface of resonator opening 114 |
| 25 | first sidewall of the resonator opening 114 |
| 26 | second sidewall of the resonator opening 114 |
| 46, 47 | electric terminals of piezoelectric component 3 |
| 50 | chamfered edge of resonator opening 114 |
| 51 | recess in the resonator 2 |
| 52 | material bulge at recess 51 |
| 80 | longitudinal axis of resonator 2 |
| 81 | axis perpendicular to plane of symmetry 8 |
| 82 | longitudinal axis of piezoelectric component 3 |
| 83 | vertical symmetry plane of resonator 2 |
| 99 | foamed material |
| 105 | axis of rotation of movable element 4 |
| 106 | first principal resonator 2 surface |
| 107 | second principal resonator 2 surface |
| 109 | notch in wall of resonator opening 114 |
| 114 | resonator 2 opening |
| 156 | circuit diagram representation of the piezoelectric component 3 |
| 157 | inductive element |
| 201 | capacitive curve |
| 202 | admittance magnitude curve of the piezoelectric motor 1 |
| 204, 205 | spike maxima of curve 202 |
| 207 | protrusions on the end wall 231 |
| 209 | inclination on end wall 231 |
| 210, 211 | admittance phase dips |
| 212 | admittance phase curve |
| 231 | end wall of the resonator opening 114 |
| 305 | diagram representation of elastic element 5 |
| 307 | diagram representation of coil spring 7 |
| 399 | dashpot representation of foamed material 99 |
| LF | resonator 2 width in the region of the side walls 25, 26 that have the shape of a circular section |
| LD | width of the piezoelectric component 3 |
| LC | height of the piezoelectric component 3 |
| LB | length of the piezoelectric component 3 |
| LE | partial height of the piezoelectric component 3 |
| LA | overall length of the resonator 2 |
| L9 | leg length of the resonator 2 |
| L5 | leg width of the resonator 2 |
| L8 | width of the recess 51 |
| L13 | depth of the recess 51 |
| L17 | width of the recess 51 |
| L14 | distance from end face of the resonator 2 to the center of the recess 51 |
| R7 | radius of material bulge 52 |
| L16 | height of the material bulge 52 |

What is claimed is:

1. A piezoelectric motor for moving a movable element in at least two directions, comprising:
    a resonator having a plane of symmetry;
    at least one piezoelectric component connected to the resonator for exciting the resonator to vibrate when an electric signal is applied to the piezoelectric component;
    wherein the piezoelectric element is located asymmetrically with respect to the resonator in such a way that the plane of symmetry of the resonator is not a plane of symmetry of the combination of resonator and piezoelectric component to cause the combination of resonator and piezoelectric component to have two distinct frequencies of operation $F_1$ and $F_2$ for moving the movable element; and
    resonance/anti-resonance pairs $(f_1, f_1')$ and $(f_2, f_2')$ such that the phase between the electric current and the electric voltage of a sinusoidal electric signal that is applied to the piezoelectric component declines for frequencies of the sinusoidal electric signal that lie inside each of the resonance/anti-resonance pairs.

2. The piezoelectric motor of claim 1, further comprising an elastic element urging the resonator onto the movable element.

3. The piezoelectric motor of claim 2, wherein the elastic element is located asymmetrically with respect to the resonator in such a way that the plane of symmetry of the resonator is not a plane of symmetry of the combination of resonator and elastic element.

4. The piezoelectric motor of claim 1, wherein the two frequencies of operation cause the movable element to move in opposite directions.

5. The piezoelectric motor of claim 1, wherein the piezoelectric component is located asymmetrically with respect to the resonator so that the two frequencies of operation $F_1$ and $F_2$ are each less than half of the frequency that is calculated as the longitudinal wave speed of the resonator material divided by the largest resonator dimension.

6. The piezoelectric motor of claim 5, wherein the resonator has an elongated shape.

7. The piezoelectric motor of claim 6, wherein the resonator has an opening for receiving the piezoelectric component.

8. The piezoelectric motor of claim 7, wherein the opening comprises notches.

9. The piezoelectric motor of claim 7, wherein the resonator forms side walls of the opening, and wherein at least one of the side walls is not straight in the longitudinal direction of the resonator.

10. The piezoelectric motor of claim 1, wherein the piezoelectric component is located asymmetrically with respect to the resonator so one frequency of operation is no more than 1.5 times the other frequency of operation.

11. The piezoelectric motor of claim 1, wherein the resonator comprises two principal surfaces that are parallel to the plane of symmetry, and wherein the cross-sections of the resonator between the principal surfaces are the same.

12. The piezoelectric motor of claim 1, wherein the at least one piezoelectric component comprises a layered configuration of electrodes and ceramics.

13. The piezoelectric motor of claim 12, wherein the at least one piezoelectric component comprises two electric terminals for applying electric signals.

14. The piezoelectric motor of claim 13, wherein the ceramics has a monolithic structure.

15. The piezoelectric motor of claim 1, wherein the resonator has an elongated shape and wherein the resonator does not execute vibrations that are pure longitudinal, torsional, or bending modes of the resonator.

16. The piezoelectric motor of claim 1, wherein the resonator comprises a single contact area for drivingly engaging the movable element during use of the piezoelectric motor.

17. The piezoelectric motor of claim 16, wherein the piezoelectric element is further located to cause the contact area of the resonator to vibrate with amplitudes that have the same order of magnitude for both frequencies of operation.

18. The piezoelectric motor of claim 1, wherein the resonator comprises a contact area for drivingly engaging the movable element during use of the piezoelectric motor, and wherein the piezoelectric element is further located to cause the resonator vibrations at the two frequencies of operation to have speed profiles that are not parallel to each other in the contact area.

19. The piezoelectric motor of claim 1, wherein the ratio of the distance $F_1$ to $f_1'$ and the distance $F_2$ to $f_2'$ has a value between 0.25 and 4.

20. The piezoelectric motor of claim 1, wherein the distance from $F_1$ to $f_1'$ or the distance from $F_2$ to $f_2'$ is at least 500 Hz.

21. The piezoelectric motor of claim 1, wherein the distance from $F_1$ to $f_1'$ or the distance from $F_2$ to $f_2'$ is more than 2 kHz.

22. The piezoelectric motor of claim 1, wherein the phase declines inside the resonance pairs $(f_1, f_1')$ and $(f_2, f_2')$ by at least 45°.

23. The piezoelectric motor of claim 22, further comprising coil spring for urging the resonator onto the movable element, the coil spring comprising windings and a foamed material that is pressed into the windings sufficiently to dampen spring vibrations and to assist the phase decline.

24. The piezoelectric motor of claim 22, wherein the piezoelectric motor is driven by a resonator circuit with an admittance that increases during $F_1$ and decreases during $f_2$.

25. The piezoelectric motor of claim 22, wherein the piezoelectric motor is driven by a resonator circuit with an admittance that increases during $F_1$ and decreases during $F_2$ with a maximum admittance occurring between $F_1$ and $f_2$.

26. The piezoelectric motor of claim 22, wherein the piezoelectric motor is driven by a resonator circuit at frequencies $F_1$ and $F_2$ within the range of 73 kHz to 84 kHz for $F_1$ and about 91 kHz to 108 kHz for $f_2$.

27. The piezoelectric motor of claim 1, wherein the phase declines inside the resonance pairs $(f_1, f_1')$ and $(f_2, f_2')$ by at least 60°.

28. The piezoelectric motor of claim 1, wherein the phase declines by the same amount for both modes of operation.

29. A piezoelectric motor for moving a movable element in at least two directions, comprising:
a resonator having a plane of symmetry;
at least one piezoelectric component connected to the resonator for exciting the resonator to vibrate when an electric signal is applied to the piezoelectric component;
wherein the piezoelectric element is located asymmetrically with respect to the resonator in such a way that the plane of symmetry of the resonator is not a plane of symmetry of the combination of resonator and piezoelectric component.

30. The piezoelectric motor of claim 29, wherein the piezoelectric element is located asymmetrically with respect to the resonator to cause the combination of resonator and piezoelectric component to have two distinct frequencies of operation $F_1$ and $F_2$ for moving the movable element.

31. The piezoelectric motor of claim 30, wherein the piezoelectric component is located asymmetrically with respect to the resonator so that the two frequencies of operation $F_1$ and $F_2$ are each less than half of the frequency that is calculated as the longitudinal wave speed of the resonator material divided by the largest resonator dimension.

32. The piezoelectric motor of claim 31, wherein the resonator has an elongated shape.

33. The piezoelectric motor of claim 32, wherein the resonator has an opening for receiving the piezoelectric component.

34. The piezoelectric motor of claim 33, wherein the resonator forms side walls of the opening, and wherein at least one of the side walls is not straight in the longitudinal direction of the resonator.

35. The piezoelectric motor of claim 30, wherein the piezoelectric component is located asymmetrically with respect to the resonator so one frequency of operation is no more than 1.5 times the other frequency of operation.

36. The piezoelectric motor of claim 29, wherein the resonator comprises a single contact area for drivingly engaging the movable element during use of the piezoelectric motor.

37. The piezoelectric motor of claim 29, wherein:
the resonator has an elongated shape;
the piezoelectric component has a plane of symmetry;
the piezoelectric component is connected to the resonator such that the resonator plane of symmetry and the piezoelectric component plane of symmetry are parallel but offset from each other.

38. The piezoelectric motor of claim 37, wherein the resonator plane of symmetry and the piezoelectric component plane of symmetry are sufficiently offset to cause the piezoelectric component to excite the elongated resonator to vibrate in a manner that is neither purely longitudinal nor purely bending.

39. The piezoelectric motor of claim 38, wherein the resonator is symmetric about two perpendicular planes intersecting along the longitudinal axis of the resonator.

40. The piezoelectric motor of claim 38, wherein the offset between the resonator plane of symmetry and the piezoelectric component plane of symmetry is sufficiently large to cause the two frequencies of operation to each be less than half of the frequency that is calculated as the longitudinal wave speed of the resonator material divided by the largest resonator dimension.

41. The piezoelectric motor of claim 37, wherein the offset between the resonator plane of symmetry and the piezoelectric component plane of symmetry is sufficiently large to cause one frequency of operation to be no more than 1.5 times the other frequency of operation.

* * * * *